US010340151B2

(12) United States Patent
Kosugi et al.

(10) Patent No.: US 10,340,151 B2
(45) Date of Patent: Jul. 2, 2019

(54) SUBSTRATE PROCESSING APPARATUS, HEATING APPARATUS, CEILING HEAT INSULATOR, AND METHOD OF MANUFACTURING SEMICONDUCTOR DEVICE

(71) Applicant: HITACHI KOKUSAI ELECTRIC INC., Tokyo (JP)

(72) Inventors: Tetsuya Kosugi, Toyama (JP); Motoya Takewaki, Toyama (JP); Masaaki Ueno, Toyama (JP); Hitoshi Murata, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 798 days.

(21) Appl. No.: 14/615,073

(22) Filed: Feb. 5, 2015

(65) Prior Publication Data

US 2015/0221532 A1    Aug. 6, 2015

(30) Foreign Application Priority Data

Feb. 6, 2014  (JP) ................................. 2014-021223

(51) Int. Cl.
*H01L 21/324* (2006.01)
*H01L 21/67* (2006.01)

(52) U.S. Cl.
CPC ...... *H01L 21/324* (2013.01); *H01L 21/67109* (2013.01)

(58) Field of Classification Search
CPC .................. H01L 21/324; H01L 21/67109
See application file for complete search history.

(56) References Cited

U.S. PATENT DOCUMENTS

| 2009/0209113 A1* | 8/2009 | Murata | C23C 16/44 |
| | | | 438/795 |
| 2010/0032425 A1* | 2/2010 | Shimada | H01L 21/67109 |
| | | | 219/439 |
| 2011/0056434 A1* | 3/2011 | Yamaguchi | C23C 16/325 |
| | | | 118/723 R |

FOREIGN PATENT DOCUMENTS

| JP | H11-111631 | 4/1999 |
| JP | 2004-311775 A | 11/2004 |
| JP | 2005-286051 A | 10/2005 |
| KR | 10-0532702 B1 | 11/2005 |
| TW | 2010-007869 A1 | 2/2010 |

OTHER PUBLICATIONS

Translation KR 10 0532702.*
Japanese Office Action, JP Application No. 2017-021223, dated Apr. 20, 2017, 2 pages (English translation).
Korean Notification of Reason for Refusal, KR Application No. 10-2015-0018546, dated Apr. 18, 2016, 7 pages (English translation provided).
Taiwanese Office Action, dated Jul. 25, 2016, 5 pages.

* cited by examiner

*Primary Examiner* — Brahime A Abraham
*Assistant Examiner* — Frederick F Calvetti
(74) *Attorney, Agent, or Firm* — Volpe and Koenig, P.C.

(57) ABSTRACT

A ceiling heat insulator installed above a side wall heat insulator of a heating apparatus for a substrate processing apparatus for processing a substrate is provided. The ceiling heat insulator includes a gas-flow path installed therein to allow a cooling gas to pass therethrough so that the ceiling heat insulator has a solid cross-sectional area in an outer edge side of the ceiling heat insulator that is smaller than that in a center side of the ceiling heat insulator.

12 Claims, 24 Drawing Sheets

SUBSTRATE PROCESSING APPARATUS, HEATING APPARATUS, CEILING HEAT INSULATOR, AND METHOD OF MANUFACTURING SEMICONDUCTOR DEVICE

CROSS-REFERENCE TO RELATED APPLICATIONS

This application is based upon and claims the benefit of priority from Japan Patent Application No. 2014-021223, filed on Feb. 6, 2014, the entire contents of which are incorporated herein by reference.

TECHNICAL FIELD

The present disclosure relates to a substrate processing apparatus, a heating apparatus, a ceiling heat insulator, and a method of manufacturing a semiconductor device.

BACKGROUND

A semiconductor manufacturing apparatus has been known as an example of a substrate processing apparatus, and a vertical-type diffusion CVD apparatus has been known as an example of a semiconductor manufacturing apparatus. In such a substrate processing apparatus, when the substrate is processed, a heating apparatus is used to heat the substrate.

As an example of the heating apparatus, there has been known an apparatus having an annular side wall heat insulator installed outside a reaction container, a heating element installed on an inner surface of the side wall heat insulator, and a ceiling heat insulator installed above the side wall heat insulator, which heats a substrate within the reaction container by means of the heating element and supplies a cooling gas to a space between the reaction container and the side wall heat insulator to cool the heated substrate, in the related art. In such a heating apparatus, the cooling gas supplied to the space between the reaction container and the side wall heat insulator is discharged outside of the heating apparatus through the ceiling heat insulator.

In this type of the heating apparatus, however, since the cooling gas is discharged through the ceiling heat insulator, a gas-flow path for the cooling gas needs to be installed on the ceiling heat insulator. Thus, a difference in thermal insulation is caused depending on portions of the ceiling heat insulator to result in a degradation of in-plane temperature uniformity of the substrate.

SUMMARY

The present disclosure provides some embodiments of constitution, which are capable of improving in-plane temperature uniformity of a substrate.

According to an aspect of the present disclosure, there is provided constitution, including: a reaction container configured to accommodate a substrate; and a heating apparatus having a side wall heat insulator installed at an outer circumference of the reaction container, a ceiling heat insulator installed above the side wall insulator, a heating element installed on an inner wall of the side wall heat insulator, and a cooling gas flow path installed between the reaction container and the side wall heat insulator, wherein the ceiling heat insulator is configured to include an gas-flow path installed therein to allow a cooling gas to pass therethrough so that the ceiling heat insulator has a thickness in an outer edge side of the ceiling heat insulator that is smaller than that in a center side of the ceiling heat insulator.

DETAILED DESCRIPTION

Hereinafter, embodiments of the present disclosure will now be described in detail with reference to the drawings.

Figure 1:
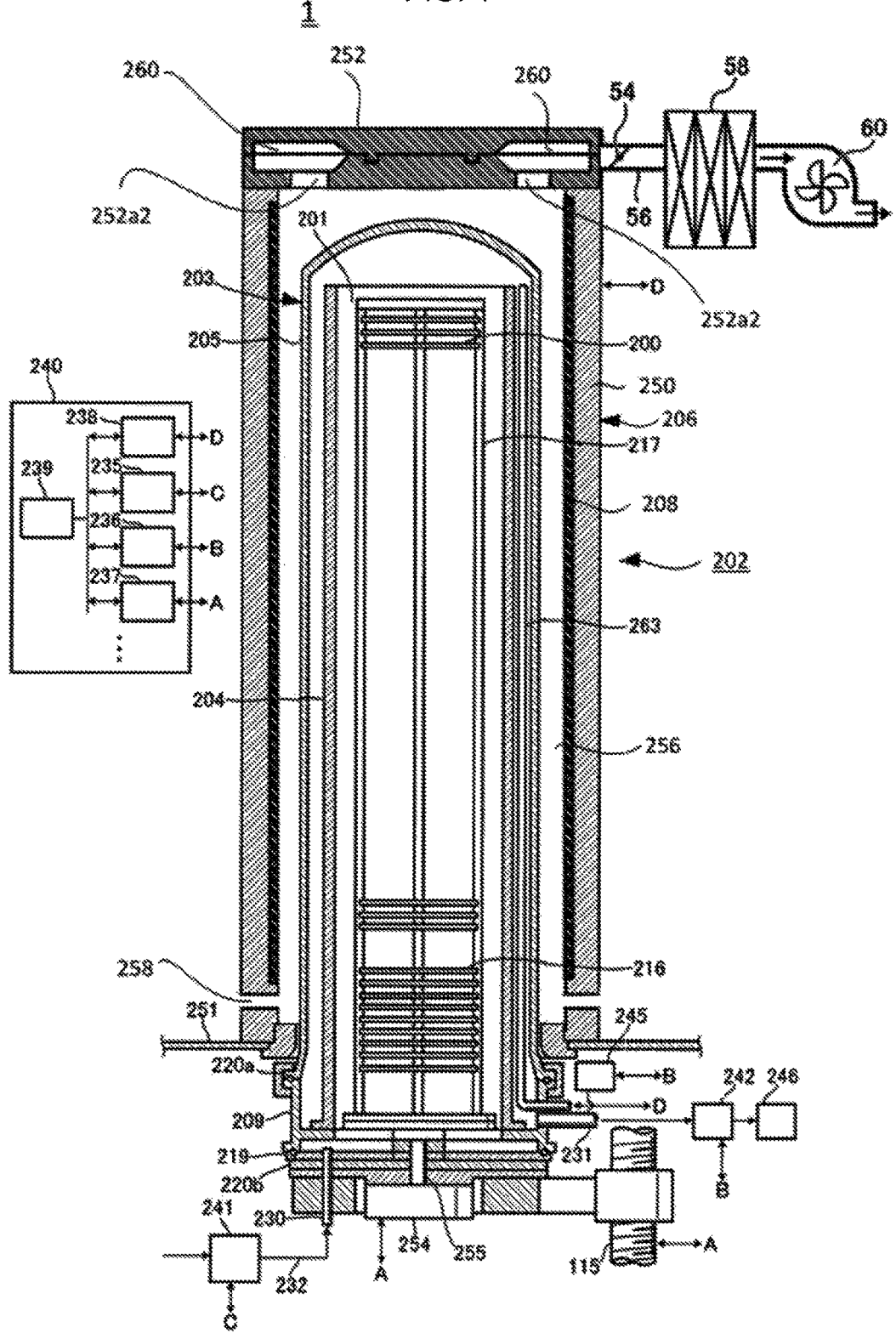
FIG. 1 is a cross-sectional view illustrating a substrate processing apparatus according to an embodiment of the present disclosure.

FIG. 1 is a cross-sectional view illustrating a substrate processing apparatus appropriately used in an embodiment of the present disclosure.

As illustrated in FIG. 1, a substrate processing apparatus 1 includes a processing furnace 202. The processing furnace 202 includes a heater 206 as a heating apparatus. The heater 206 has a cylindrical shape and is supported by a heater base 251 as a support plate so as to be installed vertically.

A process tube 203 as a reaction container is disposed within the heater 206 and has a concentric circle shape with the heater 206. In other words, the heater 206 is disposed outside the process tube 203. The process tube 203 includes an inner tube 204 as an internal reaction container and an outer tube 205 as an external reaction container installed outside the inner tube 204. The inner tube 204 is formed of a heat resistant material such as, for example, quartz ($SiO_2$) or silicon carbide (SiC), and has a cylindrical shape with an upper end and a lower end opened. A process chamber 201 is formed within the inner tube 204, and configured to accommodate wafers 200 as substrates, which are aligned to be horizontally stacked in multiple stages in a vertical direction by a boat 217. The outer tube 205 is also formed of a heat resistant material such as, for example, quartz or silicon carbide, and has its inner diameter greater than an outer diameter of the inner tube 204. The outer tube 205 has a cylindrical shape with the upper end closed and the lower end opened and is disposed in a concentric form with the inner tube 204.

A manifold 209 is disposed below the outer tube 205 in a concentric form with the outer tube 205. The manifold 209 is made of, for example, a stainless steel, and formed to have a cylindrical shape with upper and lower ends opened. The manifold 209 is engaged to the inner tube 204 and the outer tube 205 to support them. Further, an O-ring 220a as a seal member is installed between the manifold 209 and the outer tube 205. The manifold 209 is supported by the heater base 251 so that the process tube 203 is installed vertically. The reaction container is formed by the process tube 203 and the manifold 209.

A nozzle 230 as a gas supply part is connected to a seal cap 219 (to be described later) such that the nozzle 230 communicates with an interior of the process chamber 201. A gas supply pipe 232 is connected to the nozzle 230. A process gas source or an inert gas source (not shown) is connected to an upper stream side of the gas supply pipe 232, which is an opposite side of where the gas supply pipe 232 is connected to the nozzle 230, with a mass flow controller (MFC) 241 as a gas flow rate control unit interposed therebetween. A gas flow rate control part (gas flow rate controller) 235 is electrically connected to the MFC 241 such that a supplied gas flow rate can be controlled to be a desired amount at a desired timing.

An exhaust pipe 231 for discharging atmosphere from the interior of the process chamber 201 is installed in the manifold 209. The exhaust pipe 231 is disposed at a lower end portion of a container-like space formed by a gap between the inner tube 204 and the outer tube 205, and communicates with the container-like space. It is configured so that an evacuation device 246, such as a vacuum pump, is connected to a lower stream side of the exhaust pipe 231, which is an opposite side of where the exhaust pipe 231 is connected to the manifold 209, with a pressure sensor 245 as a pressure detector and a pressure adjusting device 242 interposed therebetween, in order to perform evacuation such that pressure within the process chamber 201 has a predetermined pressure level (vacuum degree). A pressure control part 236 (a pressure controller) is electrically connected to the pressure adjusting device 242 and the pressure sensor 245 and is configured to control the pressure within the process chamber 201 to be a desired pressure level at a desired timing by the pressure adjusting device 242 based on pressure detected by the pressure sensor 245.

The seal cap 219 is installed as a lid member of a furnace port below the manifold 209 to air-tightly seal an opening of the lower end portion of the manifold 209. The seal cap 219 is configured to be in contact with the lower end portion of the manifold 209 from below in a vertical direction. The seal cap 219 may be, for example, made of a metal such as stainless steel or the like, and has a disk shape. An O-ring 220b, which is a sealing member in contact with the lower end portion of the manifold 209, is installed at an upper surface of the seal cap 219. A rotary mechanism 254 configured to rotate the boat 217 is installed at the opposite side of the seal cap 219 from the process chamber 201. A rotary shaft 255 of the rotary mechanism 254 is connected to the boat 217 through the seal cap 219. The rotary shaft 255 is configured to rotate the wafers 200 by rotating the boat 217. The seal cap 219 is configured to be vertically elevated and lowered by a boat elevator 115, which is an elevation mechanism installed vertically outside the process tube 203, whereby the boat 217 can be loaded into or unloaded from the process chamber 201. A driving control part (driving controller) 237 is electrically connected to the rotary mechanism 254 and the boat elevator 115 to control a desired operation to occur at a desired timing.

The boat 217 is formed of a heat resistant material such as, for example, quartz or silicon carbide, and is configured to support a plurality of sheets of wafers 200, which are horizontally stacked in multiple stages with the centers thereof aligned with one another along an axial direction. Further, a plurality of sheets of insulating plates 216 as insulating members, which have a disk shape and are formed of a heat resistant material such as, for example, quartz or silicon carbide, are disposed at the lower portion of the boat 217 to be horizontally stacked in multiple stages. The insulating plates 216 prevent heat of the heater 206 from being transferred to the manifold 209.

A temperature sensor 263, which is a temperature detector, is installed within the process tube 203. A temperature control part 238 is electrically connected to the heater 206 and the temperature sensor 263. The temperature control part 238 controls the supply of electric power to the heater 206 (specifically, a heater line 208) based on temperature information detected by the temperature sensor 263. Accordingly, the wafers 200 are heated from outer edges thereof to have a temperature increased to a desired level. Further, the heater 206 also has a cooling function to cool the heated wafers 200 by a cooling gas, and this will be described later.

The gas flow rate control part 235, the pressure control part 236, the driving control part 237, and the temperature control part 238 are also configured with operating parts and input/output parts and are electrically connected to a main control part (main controller) 239 for controlling the entire substrate processing apparatus. The gas flow control part 235, the pressure control part 236, the driving control part 237, the temperature control part 238, and the main control part 239 constitute a controller 240.

Hereinafter, a method of forming a thin film on each wafer 200 through a chemical vapor deposition (CVD) as a process in manufacturing a semiconductor device in which the processing furnace 202 having the foregoing configuration is used will be described. Further, in the following descriptions, operations of the respective parts constituting the substrate processing apparatus are controlled by the controller 240.

When the plurality of sheets of wafers 200 are charged on the boat 217 (wafer charging), as illustrated in FIG. 1, the boat 217 supporting the plurality of sheets of wafers 200 is raised by the boat elevator 115 to be loaded into the process chamber 201 (boat loading). In this state, the seal cap 219 seals the lower end portion of the manifold 209 through the O-ring 220b.

The inside of the process chamber 201 is vacuum-evacuated by the evacuation device 246 to have a desired pressure (vacuum degree). Here, the interior pressure within the process chamber 201 is measured by the pressure sensor 245. The pressure adjusting device 242 is feedback-controlled based on the measured pressure. Furthermore, the inside of the process chamber 201 is heated by the heater 206 to have a desired temperature. Here, in order for the in side of the process chamber 201 to have a desired temperature distribution, the supply of electric power to the heater 206 is feedback-controlled based on the temperature information detected by the temperature sensor 263. Subsequently, the boat 217 is rotated by the rotary mechanism 254, whereby the wafers 200 are rotated.

Subsequently, a gas that has been supplied from the process gas source and controlled by the MFC 241 to have a desired flow rate flows through the gas supply pipe 232 and is supplied into the process chamber 201 via the nozzle 230. The supplied gas ascends within the process chamber 201 and flow out from the opening of the upper end portion of the inner tube 204 to the container-like space so as to be discharged from the exhaust pipe 231. When the gas passes through the inside of the process chamber 201, it comes into contact with a surface of each wafer 200. At this time, a thin film is deposited on the surface of each wafer 200 by a thermal CVD reaction.

When a preset processing period of time has lapsed, an inert gas is supplied from an inert gas source, and thus, the interior atmosphere of the process chamber 201 is substituted with the inert gas and the internal pressure of the process chamber 201 is also returned to a normal pressure. Each wafer 200 is quenched to a desired temperature by the cooling function of the heater 206.

Thereafter, the seal cap 219 is lowered down by the boat elevator 115 to open the lower end portion of the manifold 209. The processed wafers 200 supported on the boat 217 are unloaded out of the process tube 203 through the lower end portion of the manifold 209 (boat unloading). Thereafter, the processed wafers 200 are discharged from the boat 217 (wafer discharging)

Further, in this example for processing the wafers in the processing furnace of this embodiment, for example, an SiN film (silicon nitride film) may be formed, for example, with $SiH_2Cl_2$ and $NH_3$ as film forming gases under processing conditions of a processing temperature ranging from 400 to 800 degrees C., a processing pressure ranging from 1 to 50 Torr, a gas supply flow rate of the $SiH_2Cl_2$ ranging from 0.02 to 0.30 slm, and a gas supply flow rate of the $NH_3$ ranging from 0.1 to 2.0 slm. In addition, a poly-silicon film may also be formed, for example, with SiH4 as a film forming gas under processing conditions of a processing temperature ranging from 350 to 700 degrees C., a processing pressure ranging from 1 to 50 Torr, and a gas supply flow rate of the SiH4 ranging from 0.01 to 1.20 slm. The wafers 200 may be processed by consistently maintaining each processing condition at a certain value within each range.

The heater 206 will be described in detail. The heater 206 may include a side wall heat insulator 250 (a side wall heat insulating member) installed outside the process tube 203, a ceiling heat insulator (a ceiling insulating member) 252 installed above the side wall heat insulator 250, a heater line (a heating member) 208 installed in the inner wall of the side wall heat insulator 250, and a cooling gas flow path 256 installed between the process tube 203 and the side wall heat insulator 250. At least one inlet port 258 may be installed in the vicinity of the lower end portion of the side wall heat insulator 250. The flow path 256 formed within the heater 206 may communicate with the outside of the heater 206 through the inlet port 258.

The ceiling heat insulator 252 may have a hollow gas-flow path 260 installed therein. The gas-flow path 260 may communicate with the flow path 256 and also may communicate with an exhaust pipe 56 connected to an outer circumferential surface (specifically, a lateral surface) of the ceiling heat insulator 252. A damper 54 that can be opened and closed may be installed in the exhaust pipe 56. A radiator 58 and a fan 60 may be connected to a lower stream side of the damper 54. When the wafers 200 are heated by the heater 206, the damper 54 may be closed and the fan 60 may not operate. Meanwhile, when the wafers 200 are cooled by the cooling function of the heater 206, the damper 54 may be opened and the fan 60 may operate to absorb the cooling gas.

Here, the cooling function of the heater 206 will be described. The heater 206 may flow the cooling gas (for example, air or an inert gas) to the flow path 256 to cool the wafers 200, starting from outer edges thereof. The cooling gas may be supplied to the flow path 256 of the heater 206 through the inlet port 258 from the outside and may pass through the flow path 256 upwardly. Then, the cooling gas may be discharged to the outside of the substrate processing apparatus 1 through the gas-flow path 260 installed within the ceiling heat insulator 252, the exhaust pipe 56 communicating with the gas-flow path 260, the radiator 58, and the fan 60. Further, an operation of the fan 60 may be controlled by the controller 240 (for example, the temperature control part 238 therein). In FIG. 1, although the inlet port 258 is installed in a lower portion of the side wall heat insulator 250, the inlet port 258 may be installed in the vicinity of the upper end portion or in a middle position of the side wall heat insulator 250. In this case, for example, it is preferable to allow the cooling gas to pass through the inside of the side wall heat insulator 250 and be supplied toward a lower side of the flow path 256 so as to be spread to the entirety of the flow path 256.

Figure 2:
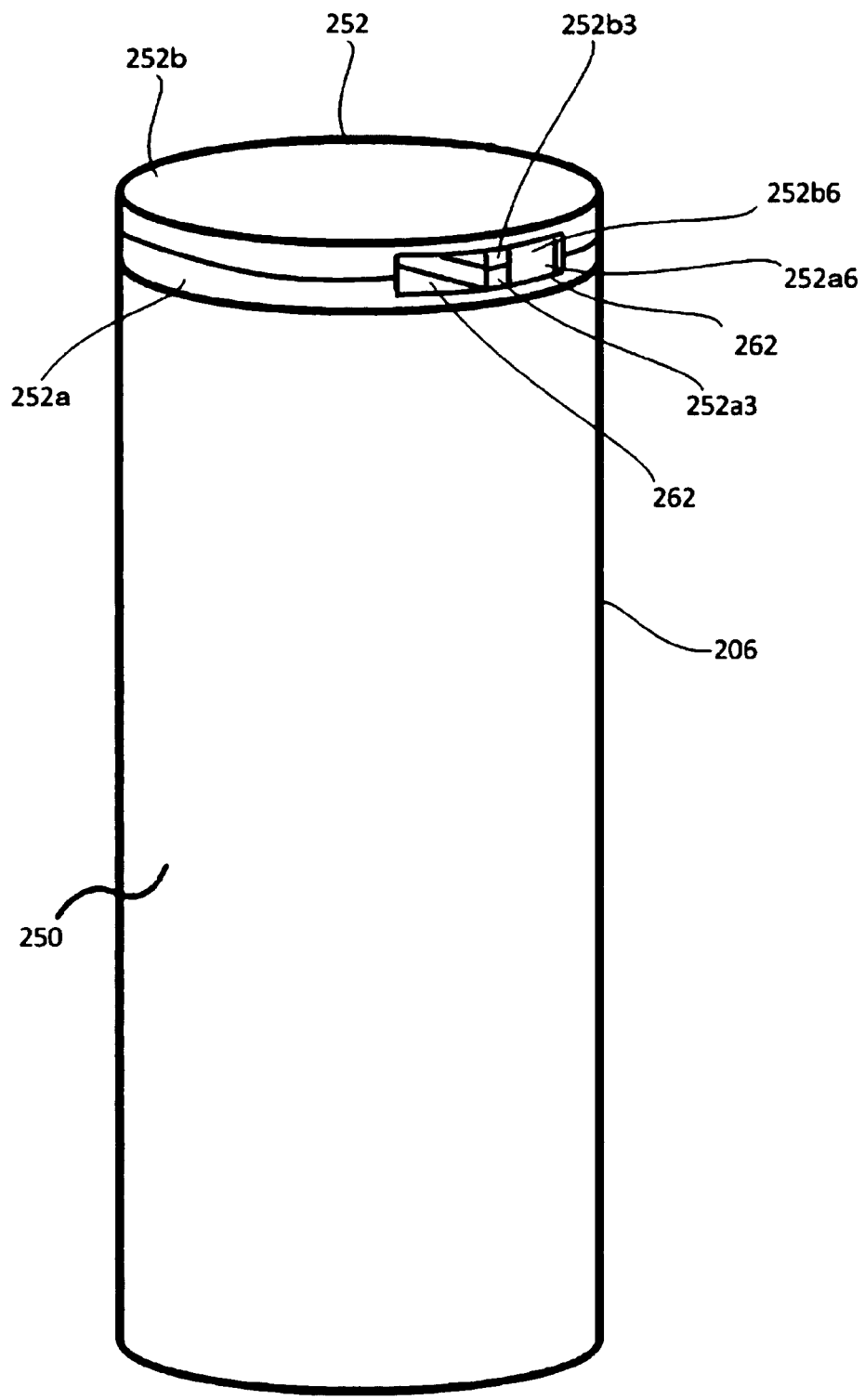
FIG. 2 is a perspective view schematically illustrating a heater according to an embodiment of the present disclosure.

Hereinafter, a characteristic structure of the ceiling heat insulator 252 in the present disclosure will be described in detail. FIG. 2 is a perspective view schematically illustrating the heater 206. Further, FIG. 3 is an enlarged cross-sectional view of the ceiling heat insulator 252.

The ceiling heat insulator 252 may be formed of a highly heat resistant material (for example, ceramics or the like). As illustrated in FIG. 2, the ceiling heat insulator 252 has a circular shape when viewed from a plan view. A plurality of exhaust port 262 may be formed to be adjacent on the outer circumferential surface (specifically, on the lateral surface) of the ceiling heat insulator 252. Each of the plurality of exhaust port 262 may communicate with the respective gas-flow path 260. Also, the inlet port 258 is omitted in FIG. 2.

Figure 3:
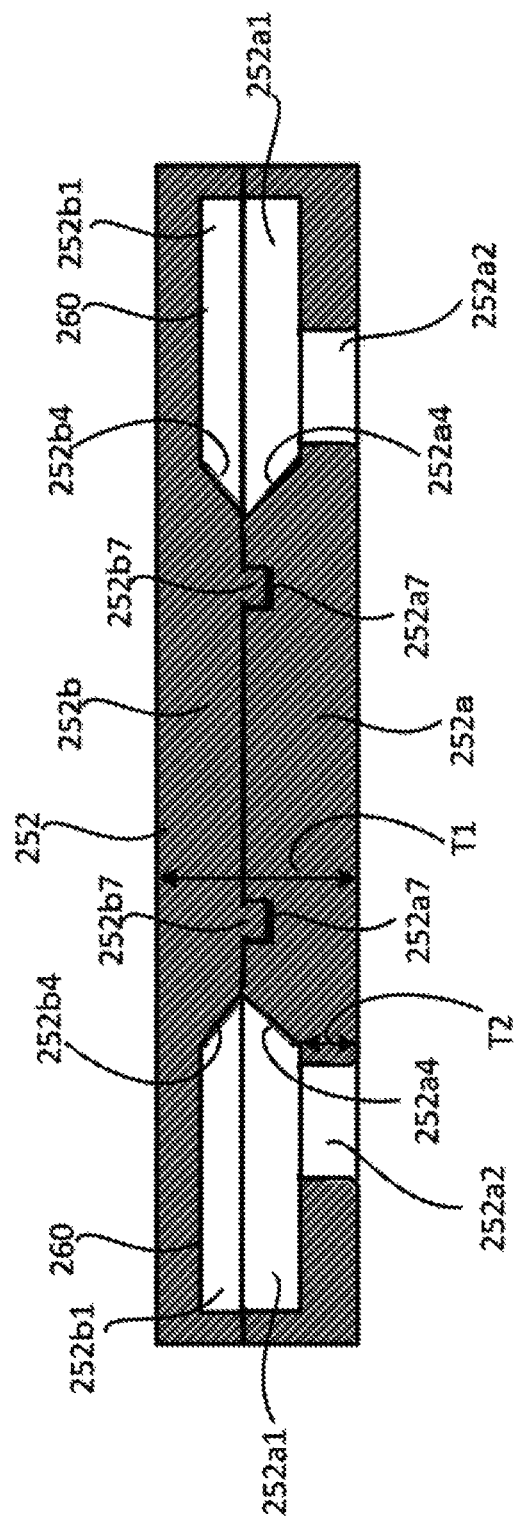
FIG. 3 is an enlarged cross-sectional view of a ceiling heat insulator according to an embodiment of the present disclosure.

As illustrated in FIGS. 2 and 3, the ceiling heat insulator 252 includes a plurality of members (specifically, two members 252a and 252b) stacked in a vertical direction. Hereinafter, the lower member 252a will be referred to as a "lower heat insulator" and the upper member 252b will be referred to as an "upper heat insulator".

Figure 4:
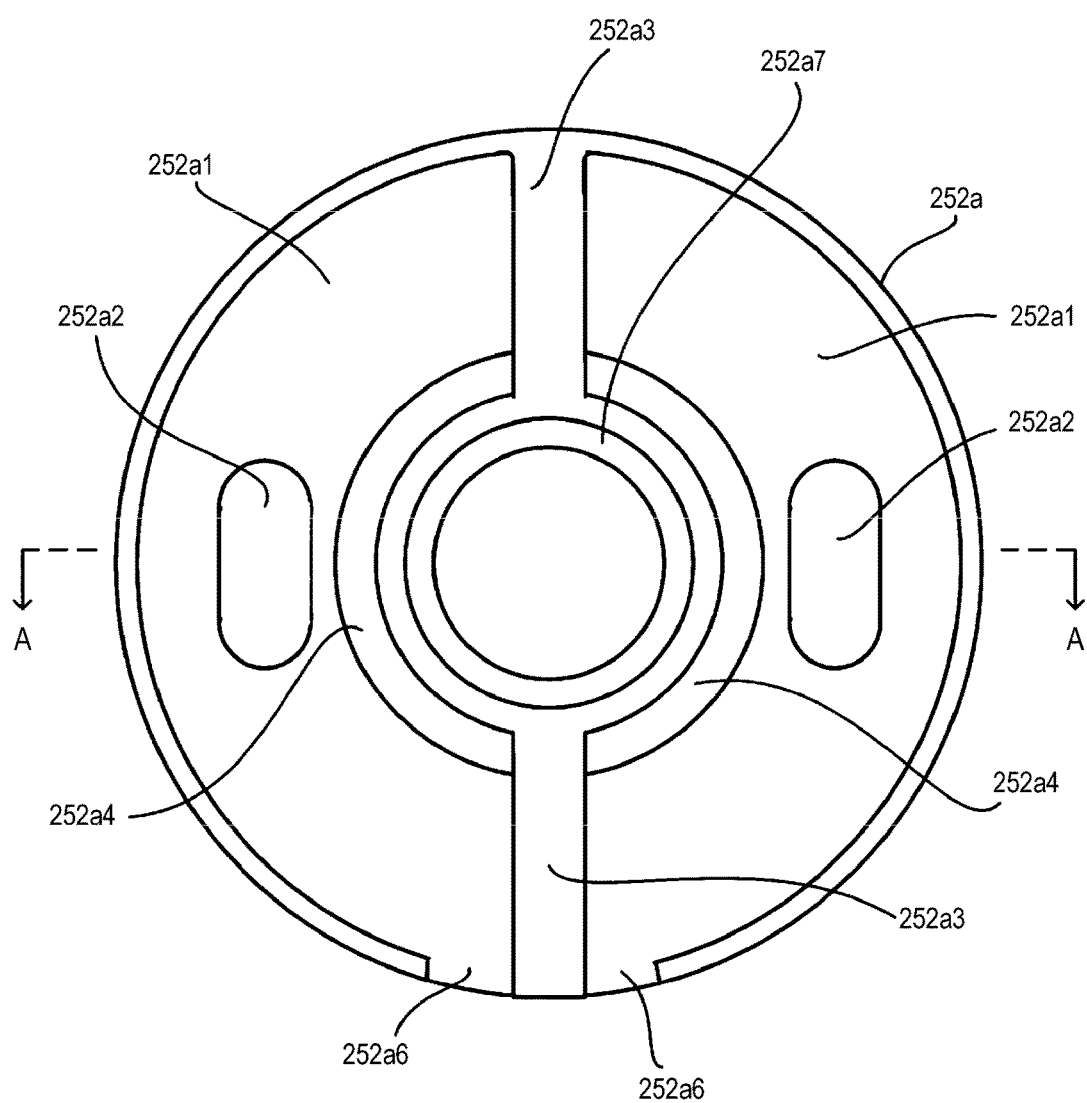
FIG. 4 is a top view of a lower heat insulator according to an embodiment of the present disclosure.
Figure 5:
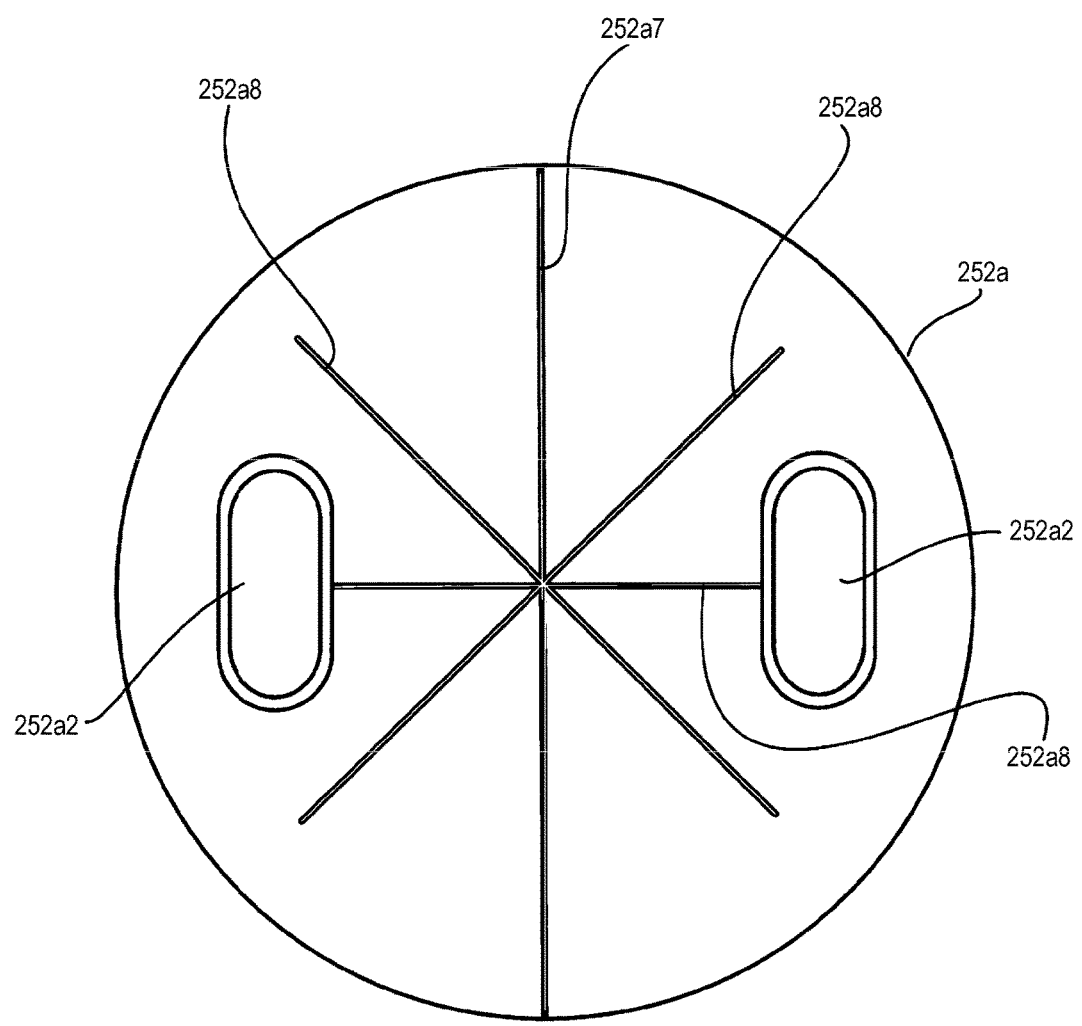
FIG. 5 is a bottom view of the lower heat insulator according to an embodiment of the present disclosure.
Figure 6:
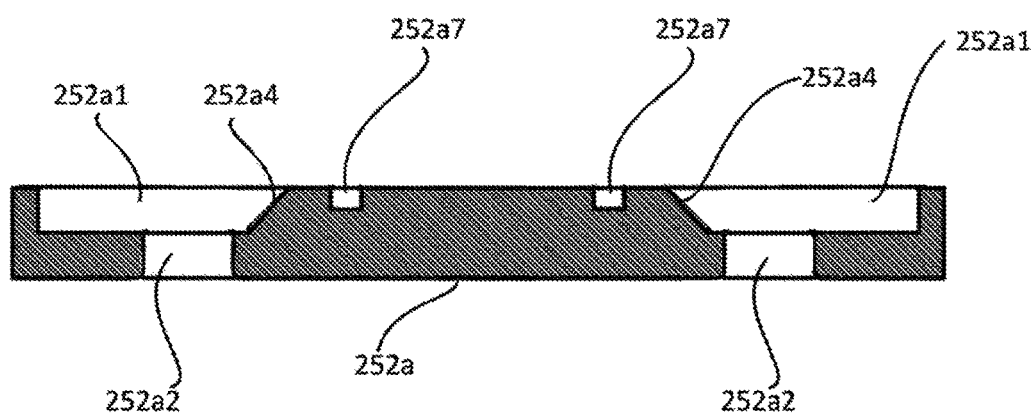
FIG. 6 is a cross-sectional view of the lower heat insulator in FIG. 4, taken along line A-A.

FIG. 4 is a top view of the lower heat insulator 252a and FIG. 5 is a bottom view of the lower heat insulator 252a. FIG. 6 is a cross-sectional view taken along line A-A of FIG. 4. As illustrated in FIGS. 4 to 6, the lower heat insulator 252a may include a plurality of concave portions (specifically, two concave portions 252a1) formed on an upper surface thereof. The concave portions 252a1 may also be referred to as a counterbore portion having side walls on a circumference thereof. The two concave portions 252a1 may be formed to be symmetrical with respect to a certain central line on a horizontal plane of the ceiling heat insulator 252 therebetween. A supply port 252a2 communicating with the flow path 256 of the heater 206 may be formed on a lower portion of each of the concave portions 252a1. The concave portions 252a1 may be formed in a position outside the outer edges of the wafers 200 accommodated in the process tube 203, when viewed from a plan view. Thus, the supply ports 252a2 may be also formed in a position outside the outer edges of the wafers 200, when viewed from a plan view. In addition, a plurality of supply ports 252a2 may be formed on a concentric circle having its center on a center of the ceiling heat insulator 252 to be spaced apart from one another as much as possible. In the illustrated example, the two supply ports 252a2 are formed to be spaced apart by about 180° on the concentric circle.

Specifically, the concave portions 252a1 may be formed to respectively have a circular arc shape, having its center on a central portion of the lower heat insulator 252a. A lower heat insulating wall 252a3 may be formed between the two concave portions 252a1 to divide them spatially. Further, each concave portion 252a1 may have a tapered portion 252a4 at a side that is close to the center of the ceiling heat insulator 252 so that a depth of the concave portion 252a1 gets reduced toward the center of the ceiling heat insulator 252. Also, in each concave portion 252a1, a cutout portion 252a6 may be formed on a side wall at an outer edge adjacent to the lower heat insulating wall 252a3.

An annular recess portion 252a7 may be formed at an inner side (at a central side of the lower heat insulator 252a) of the concave portion 252a1 on the upper surface of the lower heat insulator 252a. Further, on a bottom surface of the lower heat insulator 252a, a plurality of groove portions 252a8 may be formed radially from the central portion of the lower heat insulator 252a. The groove portions 252a8 are grooves for alleviating stress. The groove portions 252a8 may alleviate the stress generated when the ceiling heat insulator 252 is heated to prevent damage to the ceiling heat insulator 252. At least one of the groove portions 252a8 may be connected to the supply ports 252a2. At least one of the groove portions 252a8 may be configured to reach the outer circumference of the lower heat insulator 252a. At least one of the groove portions 252a8 may be configured not to reach the outer circumference of the lower heat insulator 252a.

Figure 7:
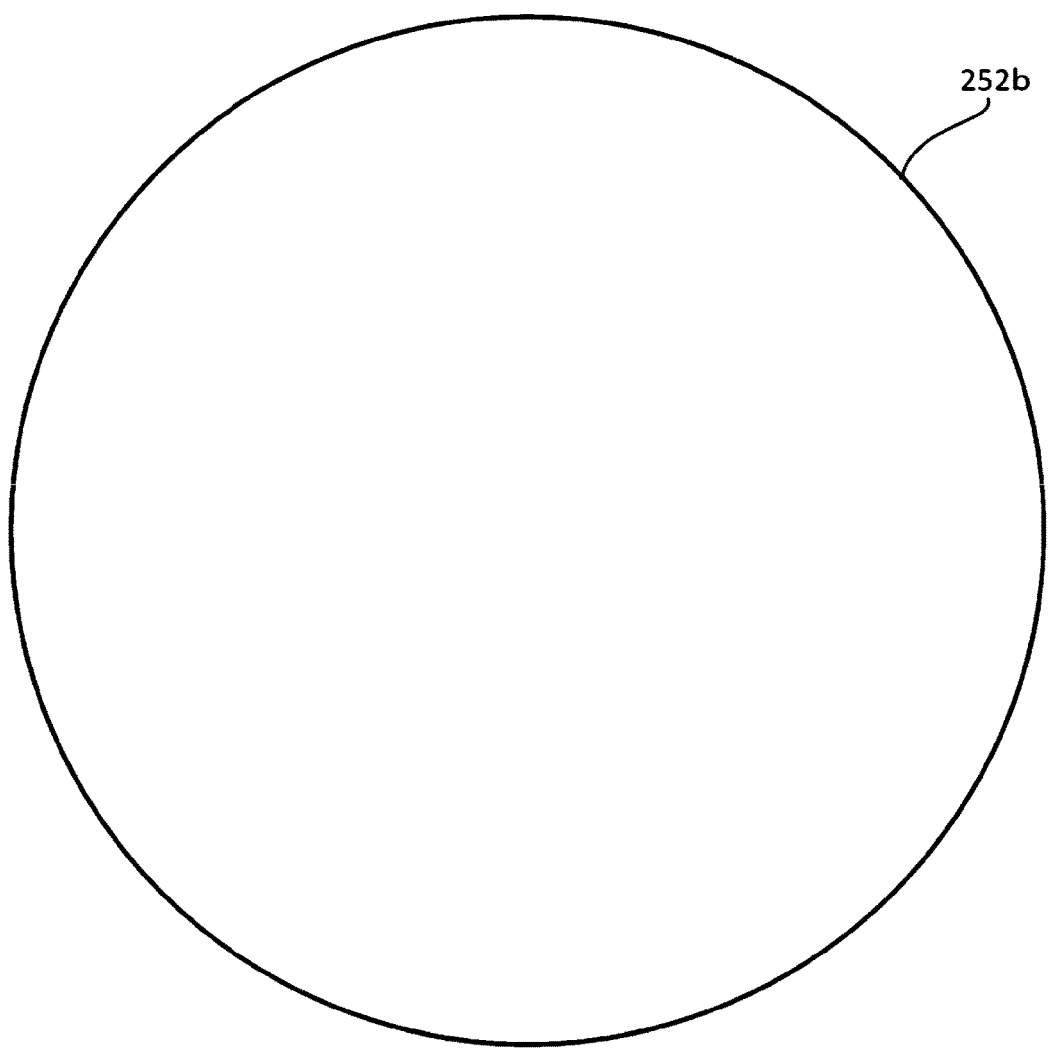
FIG. 7 is a top view of an upper heat insulator according to an embodiment of the present disclosure.
Figure 8:
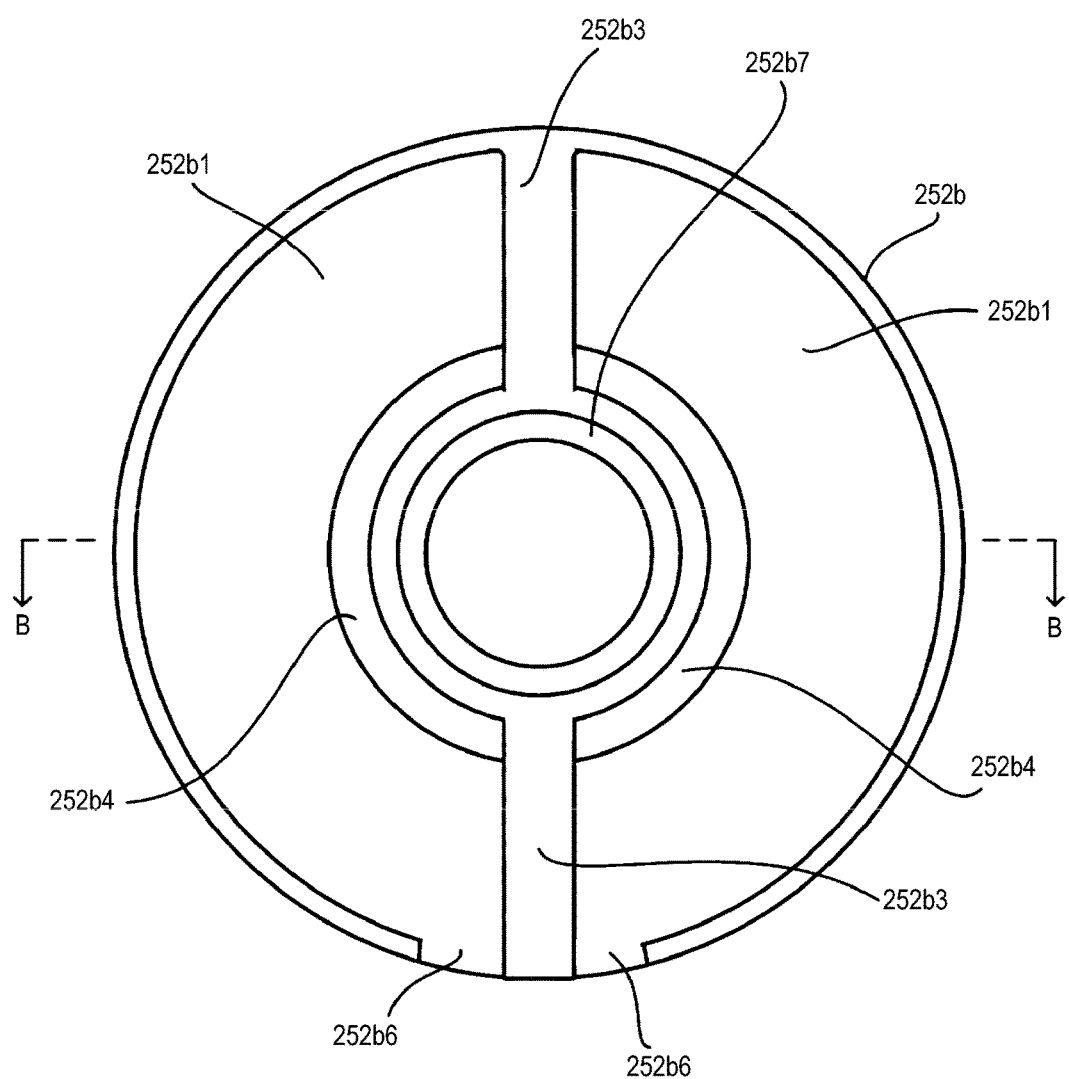
FIG. 8 is a bottom view of the upper heat insulator according to an embodiment of the present disclosure.
Figure 9:
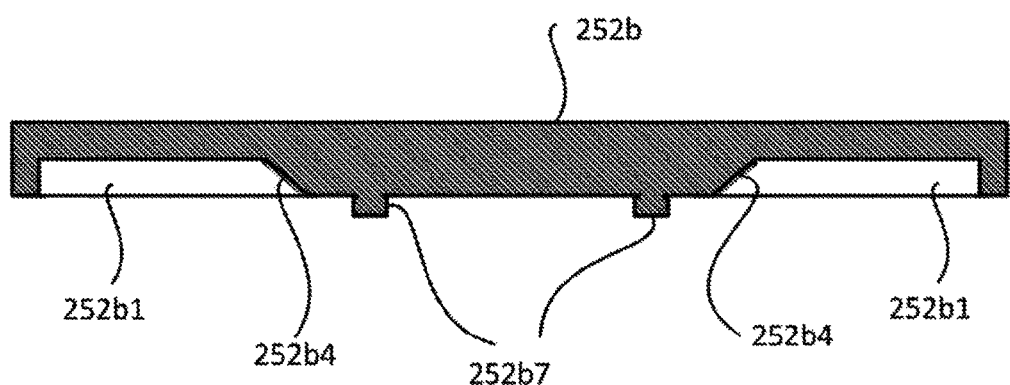
FIG. 9 is a cross-sectional view of the upper heat insulator of FIG. 8, taken along line B-B.

FIG. 7 is a top view of the upper heat insulator 252b. FIG. 8 is a bottom view of the upper heat insulator 252b. Further, FIG. 9 is a cross-sectional view taken along line B-B of FIG. 8. As illustrated in FIGS. 7 to 9, the upper heat insulator 252b includes a plurality of concave portions (specifically, two concave portions 252b1) formed on a bottom surface thereof. The concave portions 252b1 may also be referred to as a counterbore portion having side walls on a circumference thereof. The two concave portions 252b1 may be formed to be symmetrical with respect to a certain central line on a horizontal plane of the ceiling heat insulator 252 therebetween. The concave portions 252b1 may be formed in a position outside the outer edges of the wafers 200 accommodated in the process tube 203, when viewed from a plan view.

Specifically, the concave portions 252b1 may be formed to respectively have a circular arc shape, having its center on a central portion of the upper heat insulator 252b. An upper heat insulating wall 252b3 may be formed between the two concave portions 252b1 to divide them spatially. Further, each concave portion 251b1 may have a tapered portion 252b4 at a side that is close to the center of the ceiling heat insulator 252 so that a depth of the concave portion 252b1 gets reduced toward the center of the ceiling heat insulator 252. Also, in each concave portion 252b1, a cutout portion 252b6 may be formed on a side wall at an outer edge adjacent to the upper heat insulating wall 252b3. Further, on a bottom surface of the upper heat insulator 252b, an annular protrusion 252b7 may be formed in an inner side of the concave portion 252b1.

The concave portions 252a1 of the lower heat insulator 252a and the concave portions 252b1 of the upper heat insulator 252b may be formed to be symmetrical or substantially symmetrical in shape when the upper surface of the lower heat insulator 252a and the bottom surface of the upper heat insulator 252b overlap with each other, except that the concave portions 252a1 of the lower heat insulator 252a include the supply ports 252a2.

As illustrated in FIG. 3, the lower heat insulator 252a and the upper heat insulator 252b may overlap with each other so that the concave portions 252a1 of the lower heat insulator 252a and the concave portions 252b1 of the upper heat insulator 252b are disposed in a facing manner to form two gas-flow paths 260. As described above, since each of the concave portions 252a1 and 252b1 has a circular arc shape having its center on the central portion of the insulators 252a and 252b, each gas-flow path 260 is also formed to have a circular arc shape having its center on the central portion of the ceiling heat insulator 252.

Since the ceiling heat insulator 252 includes the gas-flow paths 260 installed therein, respectively having a circular arc shape having the center on the central portion of the ceiling heat insulator 252, a thickness T2 of an outer edge side is smaller than a thickness T1 of a center side (in FIG. 3). Here, the "thickness" of the ceiling heat insulator 252 indicates a thickness of the ceiling heat insulator in a vertical direction. In particular, as indicated by T2 in FIG. 3, the thickness of the ceiling heat insulator 252 indicates a consecutive length along which the member extends from the bottom surface toward the upper surface. If a space such as the gas-flow paths 260 is present within the ceiling heat insulator 252, a sum of the thicknesses of the members of the lower side and the upper side of the corresponding space may be considered as the "thickness". As described above, since the thickness T2 at the outer edge is smaller than the thickness T1 at the center side, a solid cross-sectional area (the area excluding the hollow portion in a vertical cross-section) of the ceiling heat insulator 252 in the outer edge is smaller than that in the center side. FIGS. 1 and 3 include the cross-section views taken along line A-A of FIG. 4 or taken along line B-B of FIG. 8. FIGS. 1 and 3 include the cross-section of the substrate processing apparatus 1 and the cross-section of the ceiling heat insulator 252, respectively.

Since the lower insulating wall 252a3 and the upper insulating wall 252b3 are installed between the gas-flow paths 260, the gas-flow paths 260 may be spatially separated within the ceiling heat insulator 252. Further, the gas-flow paths 260 may be formed as spaces of circular arc shapes having their center at the central portion of the ceiling heat insulator 252 by the concave portions 252a1 and 252b1 and may be installed in a position outside the wafers 200 when viewed from a plan view. Also, due to the tapered portion 252a4 of the lower heat insulator 252a and the tapered portion 252b4 of the upper heat insulator 252b, the gas-flow paths 260 may be formed to have a cross-sectional area reduced in a direction toward the center side of the ceiling heat insulator 252. In other words, the ceiling heat insulator 252 is formed to have a solid cross-sectional area that is increased toward the center side thereof.

Further, when the lower heat insulator 252a and the upper heat insulator 252b overlap with each other, the protrusion portions 252b7 of the upper heat insulator 252b may be fitted to the recess portions 252a7 of the lower heat insulator 252a. Accordingly, the lower heat insulator 252a and the upper heat insulator 252b may be adjusted and fixed in their positions. In order to fix the lower heat insulator 252a and the upper heat insulator 252b, for example, an adhesive may also be used additionally.

Also, as the lower heat insulator 252a and the upper heat insulator 252b overlap with each other, the cutout portion 252a6 of the lower heat insulator 252a and the cutout portion 252b6 of the upper heat insulator are disposed to face each other, forming the exhaust ports 262 in the gas-flow paths 260, respectively, as described above. The exhaust ports 262 installed in the gas-flow paths 260 may be adjacent with the lower insulating wall 252a3 and the upper insulating wall 25b3 interposed therebetween (see FIG. 2).

Figure 10:
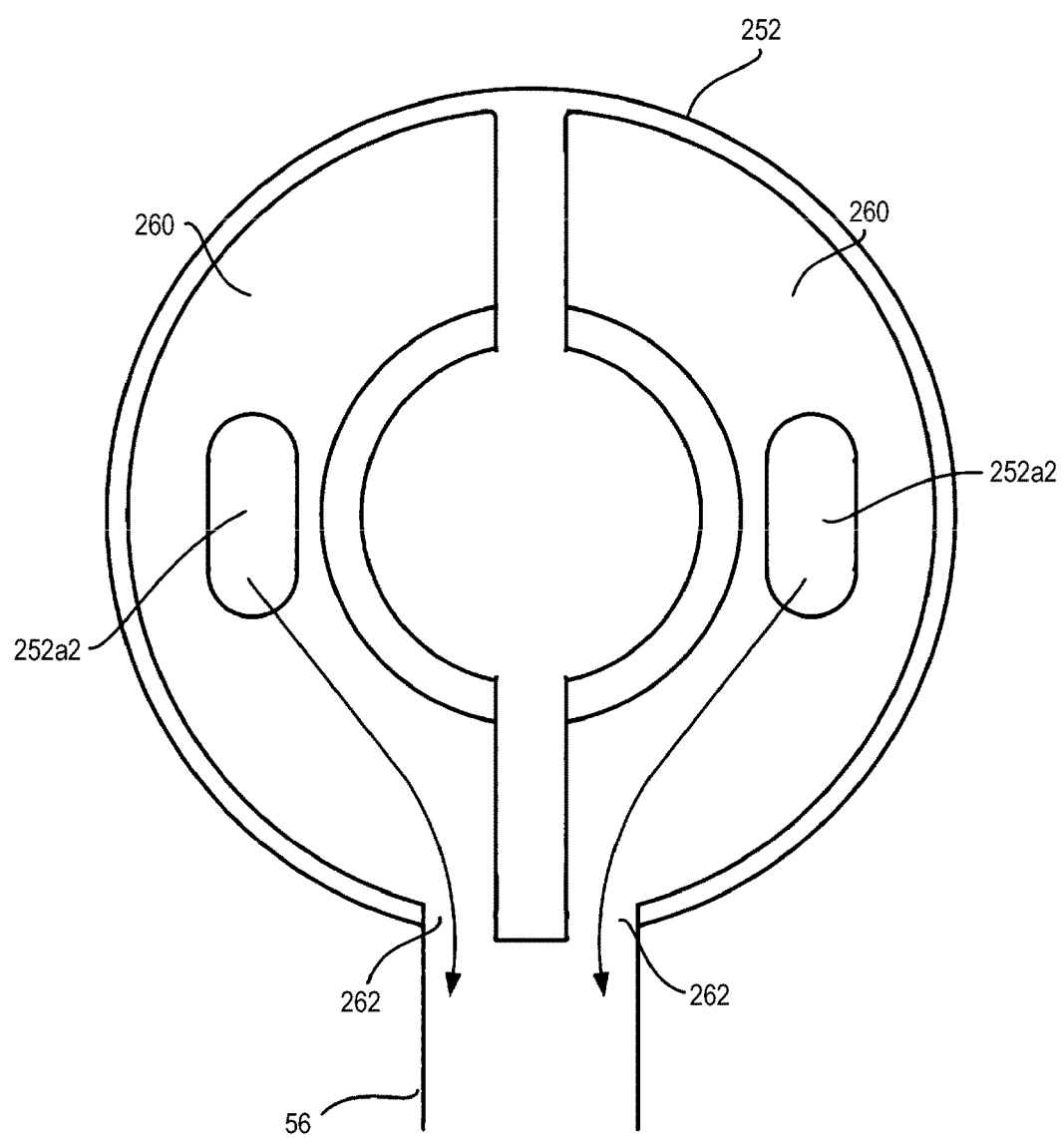
FIG. 10 is a view illustrating a flow of a cooling gas within the ceiling heat insulator according to an embodiment of the present disclosure.

FIG. 10 is a view illustrating a flow of a cooling gas within the ceiling heat insulator 252. As illustrated in FIG. 10, the cooling gas supplied to the ceiling heat insulator 252 through the supply ports 252a2 in the gas-flow paths 260 may fill the gas-flow paths 260 and may flow to the exhaust pipe 56 through the exhaust ports 262 in the gas-flow paths 260 so as to be discharged to the outside of the substrate processing apparatus 1.

Figure 11:
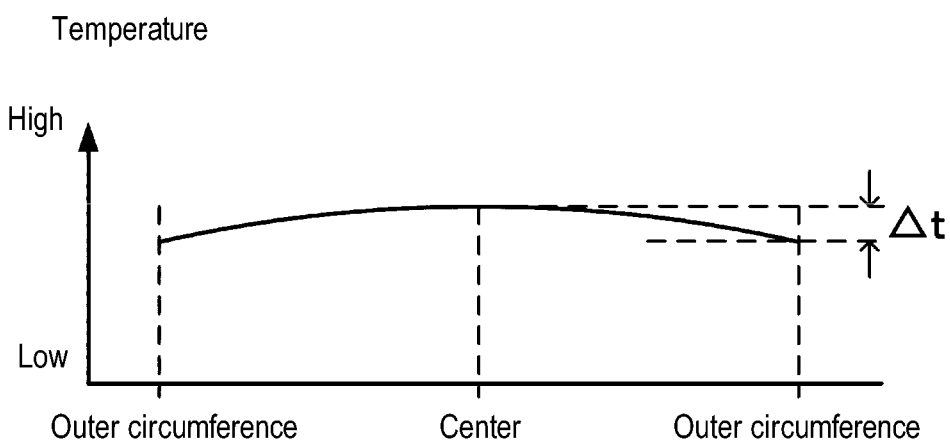
FIG. 11 is a view illustrating temperature distribution in a cross-section of a wafer when a heater according to an embodiment of the present disclosure is used.
Figure 12:
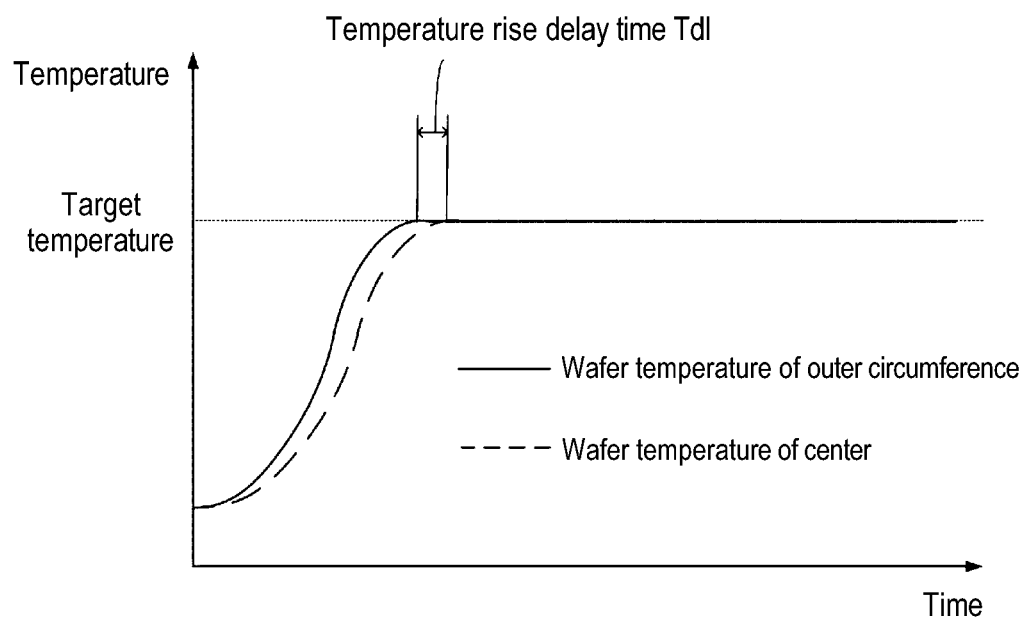
FIG. 12 is a view illustrating a temperature transition of a wafer when a heater according to an embodiment of the present disclosure is used.

Hereinafter, temperature characteristics of the wafer 200 when the heater 206 is used will be described. FIG. 11 is a view illustrating a temperature distribution in a cross-section of the wafer 200 when the heater 206 is used. Further, FIG. 12 is a view illustrating a temperature transition of the wafer 200 when the heater is used.

Here, for the convenience of understanding, wafer temperature characteristics when a different type of heater is used will be described.

Figure 13:
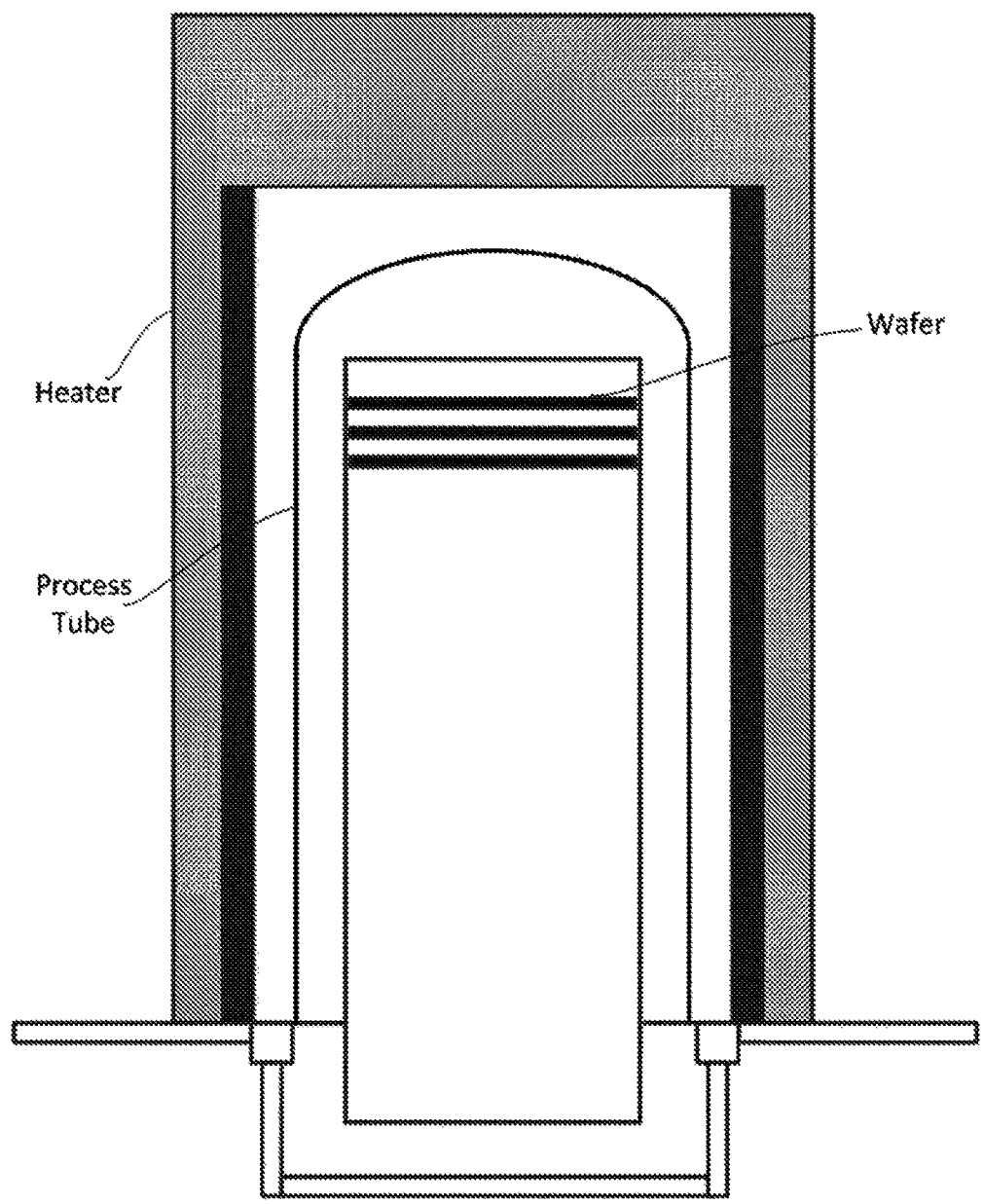
FIG. 13 is a schematic view illustrating an example of a heater without a cooling function by a cooling gas according to an embodiment of the present disclosure.
Figure 14:
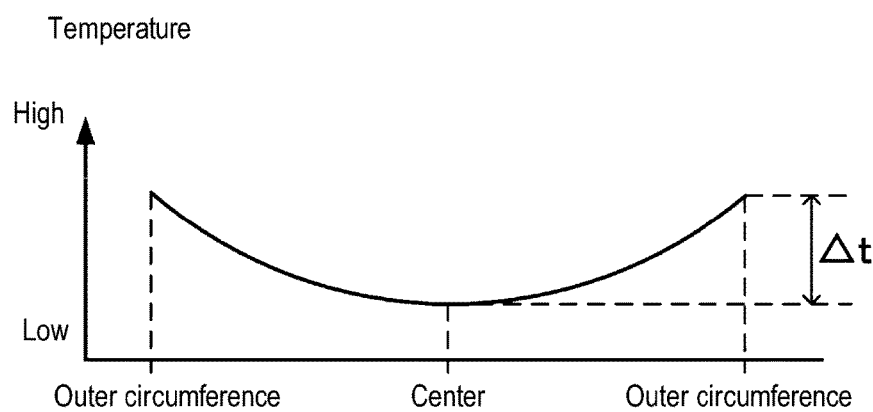
FIG. 14 is a view illustrating a temperature distribution in a cross-section of a wafer when the heater of FIG. 13 is used.

FIG. 13 is a schematic view illustrating an example of a heater without a cooling function by a cooling gas according to an embodiment of the present disclosure. Further, FIG. 14 is a view illustrating a temperature distribution in a cross-section of a wafer when the heater of FIG. 13 is used. As described above, the wafer within the process tube is heated by the heater disposed outside of the process tube. Thus, in the example of the heater illustrated in FIG. 13, the temperature of the outer edge portion of the wafer gets higher, compared with a central portion thereof, as described in FIG. 14. In FIG. 14, a temperature difference between the central portion and the outer edge portions of the wafer is denoted by Δt.

Figure 15:
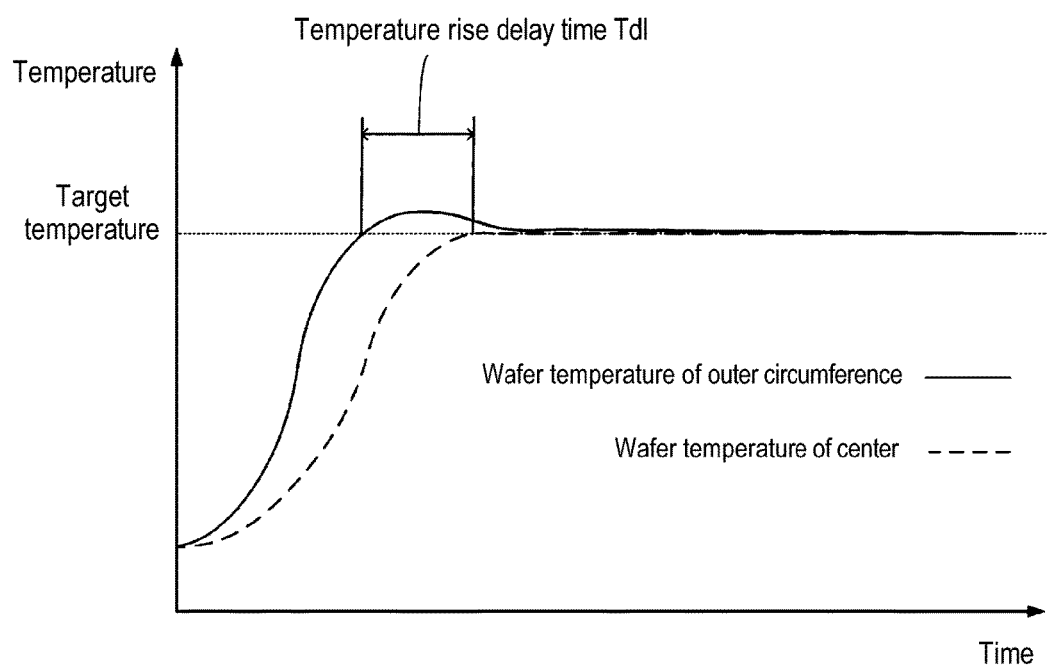
FIG. 15 is a view illustrating a temperature transition of a wafer when the heater of FIG. 13 is used.

FIG. 15 is a view illustrating a temperature transition of a wafer when the heater of FIG. 13 is used. As illustrated in FIG. 15, in the case of heating up the wafer, due to the temperature distribution tendency illustrated in FIG. 14, the temperature of the outer edge portion of the wafer first reaches a target temperature and the temperature of the central portion of the wafer reaches the target temperature later. It is desirable to reduce a temperature rise delay time Td1 because it degrades throughput of wafer processing.

Figure 16:
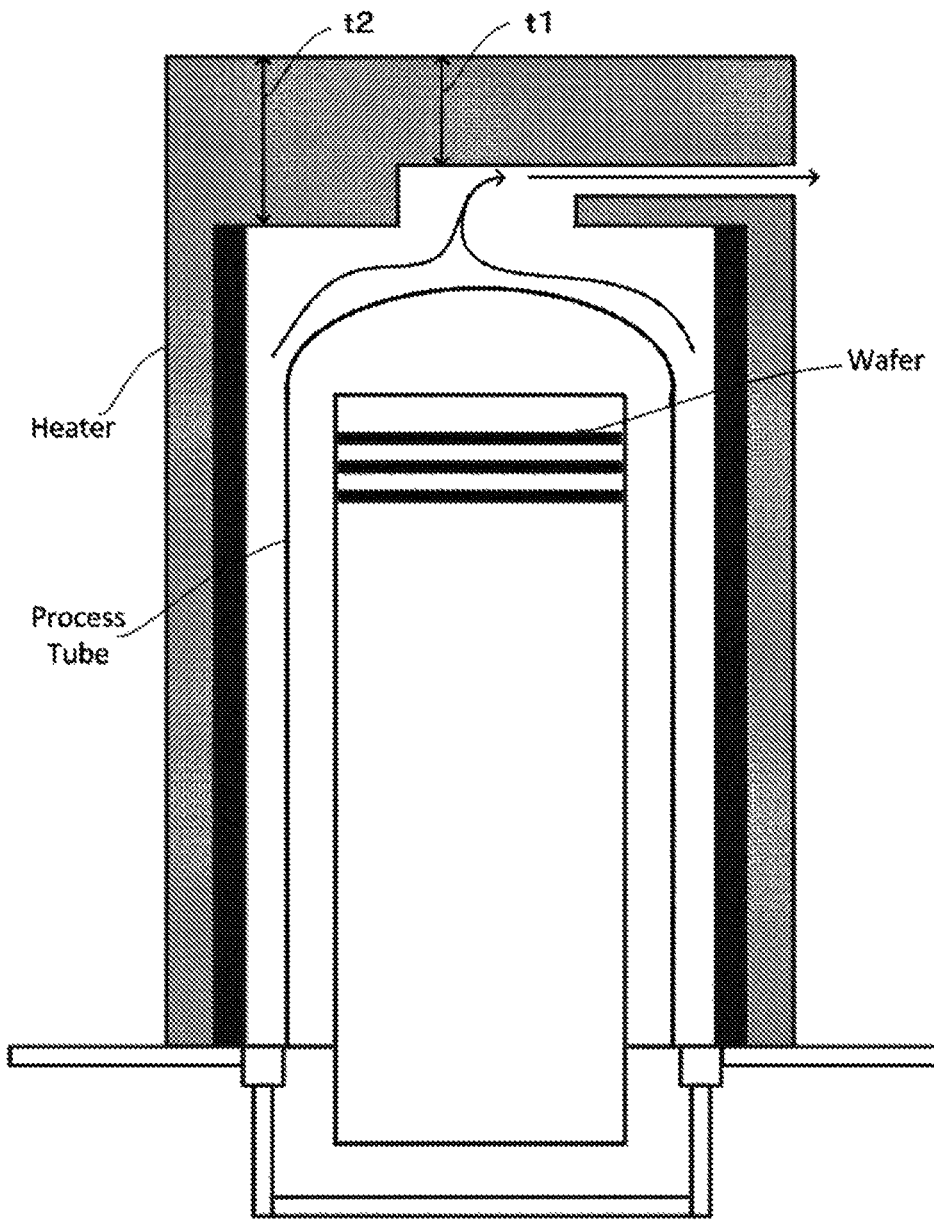
FIG. 16 is a schematic view illustrating an example of a heater having a cooling function using cooling gas.

FIG. 16 is a schematic view illustrating an example of a heater having a cooling function using a cooling gas. Unlike the heater 206 illustrated in FIGS. 1 to 10, the heater illustrated in FIG. 16 has a supply port of a cooling gas formed in a central portion of the ceiling heat insulator.

Figure 17:
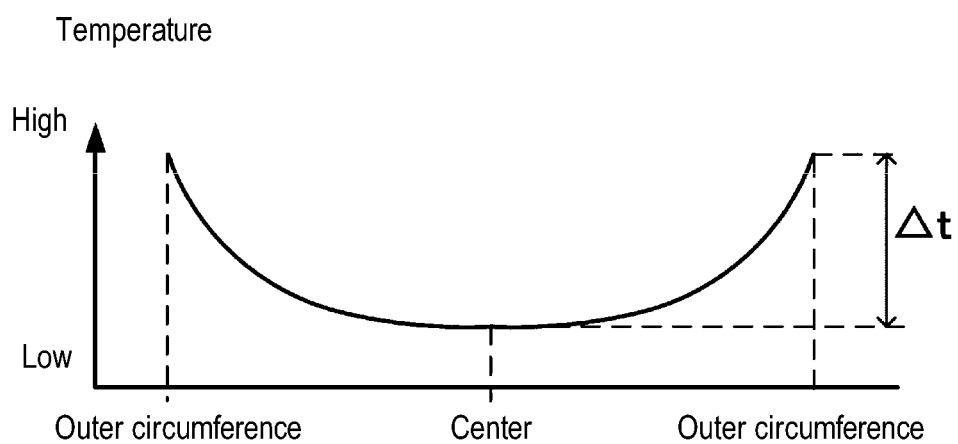
FIG. 17 is a view illustrating a temperature distribution in a cross-section of a wafer when the heater of FIG. 16 is used.

FIG. 17 is a view illustrating a temperature distribution in a cross-section of a wafer when the heater of FIG. 16 is used. In the heater illustrated in FIG. 16, since the supply port of the cooling gas is formed in the central portion of the ceiling heat insulator, a solid cross-sectional area (or a thickness) of the ceiling heat insulator in the vicinity of the central portion thereof is smaller than that in the outer edge portion (i.e., thickness T1 of the central portion<thickness T2 of the outer edge portion). Thus, heat insulating properties of the vicinity of the central portion of the ceiling heat insulator are lower than those of the outer edge portion of the ceiling heat insulator so that a temperature difference (Δt) between the central portion and the outer edge portion of the wafer further increases, as illustrated in FIG. 17. Thus, the temperature rise delay time Td1 is also highly likely to increase. This tendency increases as the wafer is loaded in a higher position of the boat. Also, when the wafer is heated by the heater, the damper within the exhaust pipe is closed so that the cooling gas stays within the heater, as described above.

Figure 18:
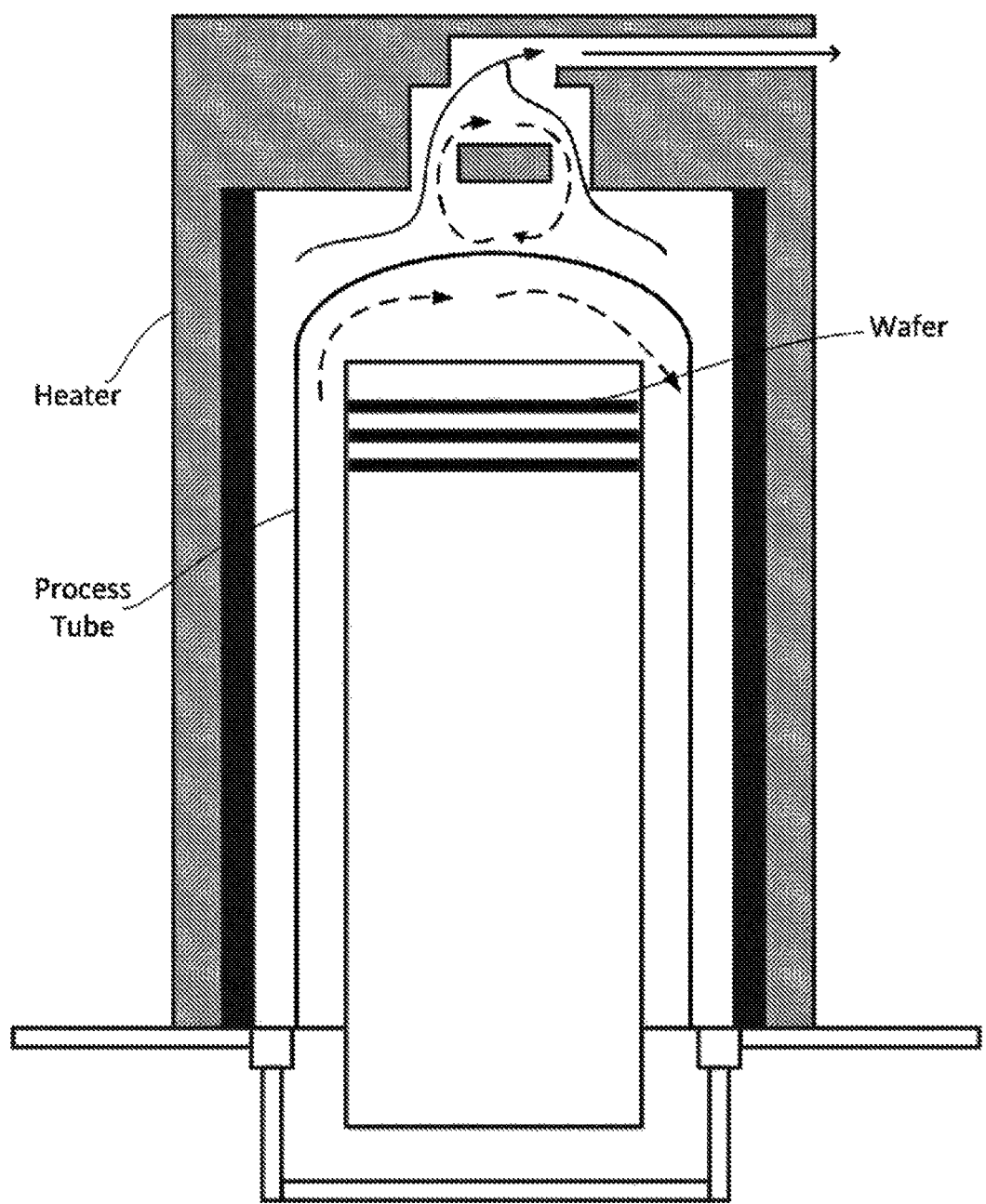
FIG. 18 is a schematic view illustrating another example of a heater having a cooling function using a cooling gas.

FIG. 18 is a schematic view illustrating another example of a heater having a cooling function using a cooling gas. The heater illustrated in FIG. 18 is configured to supply a cooling gas from an annular slit by hermetically sealing the central portion of the supply port of the cooling gas in the ceiling heat insulator of the heater illustrated in FIG. 16.

Figure 19:
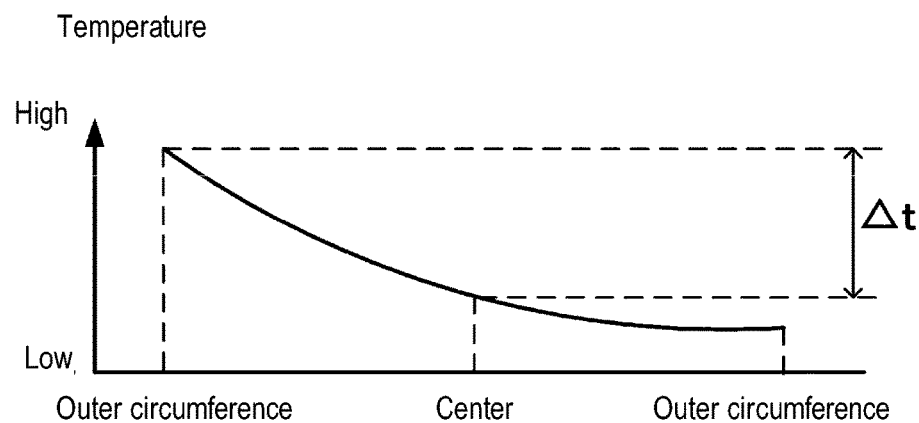
FIG. 19 is a view illustrating a temperature distribution in a cross-section of a wafer when the heater of FIG. 18 is used.
Figure 20:
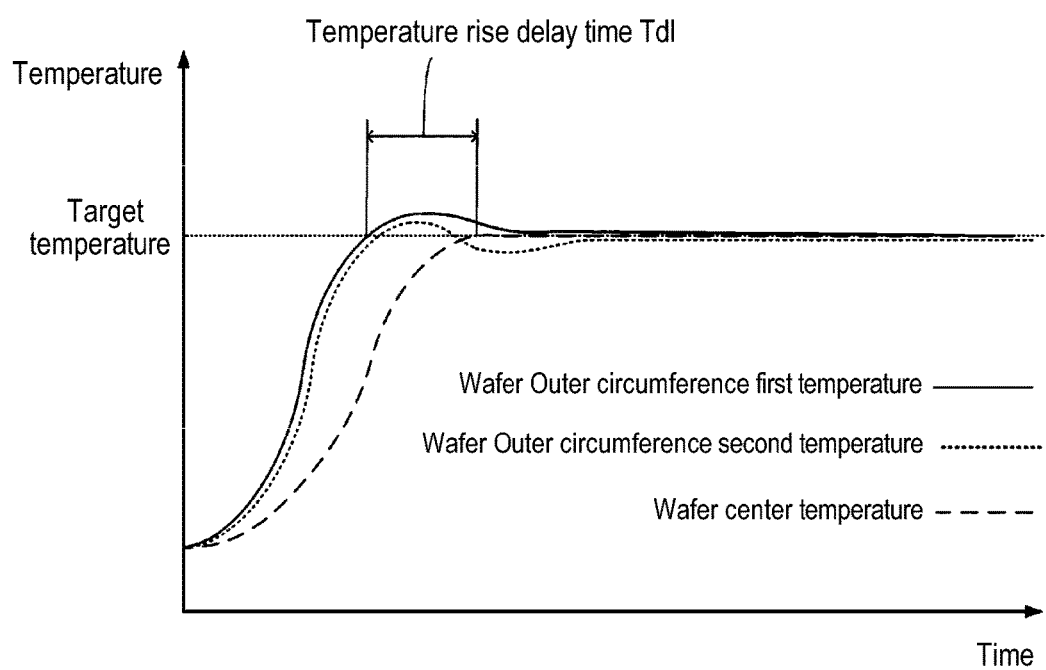
FIG. 20 is a view illustrating a temperature transition of a wafer when the heater of FIG. 18 is used.

FIG. 19 is a view illustrating a temperature distribution in a cross-section of a wafer when the heater of FIG. 18 is used. Further, FIG. 20 is a view illustrating a temperature transition of a wafer when the heater of FIG. 18 is used. In the heater illustrated in FIG. 18, heat insulating properties of the vicinity of the central portion of the ceiling heat insulator are improved, but convection of the cooling gas may be generated through the supply port of the cooling gas above the wafer. When convection of the cooling gas is generated above the wafer, as illustrated in FIG. 19, in addition a temperature difference (Δt) between the outer edge portion and the central portion of the wafer that still remains, a temperature difference between the outer edges portions of the wafer occurs. Thus, as illustrated in FIG. 20, the temperature rise delay time Td1 does not decrease.

In contrast, in the heater 206 illustrated in FIGS. 1 to 10, since the gas-flow paths 260, as spaces of a circular arc shape having their center at the center portion of the ceiling heat insulator 252, are installed to allow the cooling gas to pass therethrough, the solid cross-sectional area (the thickness) of the ceiling heat insulator 252 in the outer edge side is smaller than that in the center side of the ceiling heat insulator 252 so that heat insulating properties of the ceiling heat insulator 252 are lower in the outer edge side than those in the center side. Accordingly, the tendency of the temperature distribution illustrated in FIG. 14 generated as the wafer 200 is heated starting from the outer edge side thereof, can be canceled out. Thus, as illustrated in FIG. 11, the in-plane temperature distribution of the wafer 200 is substantially uniform from the center portion to the outer edge and the in-plane temperature uniformity of the wafer 200 is enhanced. Further, accordingly, as illustrated in FIG. 12, the temperature rise delay time Td1 can be reduced, compared with the examples illustrated in FIGS. 13 to 20.

Also, in the gas-flow paths 260, the supply ports 252a2 allowing the cooling gas to be supplied therethrough are formed in an outer position of the wafer 200 when viewed from a plan view. Thus, even though convection is generated in the cooling gas supplied to the gas-flow paths 260 from the supply ports 252a2, since the outer edge side of the wafer 200 is cooled, the temperature at the center side of the wafer is prevented from being lowered so that the in-plane temperature uniformity is prevented from being negative effect. Further, even though heat insulating properties of the portion where the supply ports 252a2 are formed are most degraded, the in-plane temperature uniformity is not damaged in that the portion where the supply ports 252a2 are formed is positioned outside the outer edge portion of the wafer 200, when viewed from a plan view, not being positioned immediately above the wafer 200, and the wafer 200 is heated, starting from the outer edge side thereof, by the heater 206.

Similarly, since the gas-flow paths 260 are installed in the position outside the wafer 200 when viewed from a plan view, the temperature of the center side of the wafer is not lowered by the cooling gas staying in the gas-flow path 260.

Further, since the plurality of gas-flow paths 260 are installed and the insulating walls 252a3 and 252b3 are installed between the gas-flow paths 260, heat exchange between the gas-flow paths 260 may be restrained so that convection of the cooling gas staying in the gas-flow paths 260 can be restrained.

Further, since each of the plurality of gas-flow paths 260 has the respective supply port 252a2 and the respective exhaust port 262, the supply ports 252a2 are not connected via the gas-flow paths 260 so that the convection of a cooling gas may be more effectively restrained.

Further, since the gas-flow paths 260 are formed such that a cross-sectional area thereof is reduced toward the center side of the ceiling heat insulator 252 (in other words, the solid cross-sectional area of the ceiling heat insulator 252 increases toward the center side), the heat insulating properties of the ceiling heat insulator 252 are gradually changed (i.e., enhanced) toward the center side of the ceiling heat insulator 252. Thus, a temperature distribution of the wafer 200 can become more effectively uniformized and a temperature gradient can become gentle.

Further, since the plurality of supply ports 252a2 are formed to be spaced apart from one another as much as possible on the concentric circle having its center on the center portion of the ceiling heat insulator 252, portions of the ceiling heat insulator 252 where heat insulating properties thereof are most degraded are evenly distributed, negative effect on the in-plane temperature uniformity of the wafer 200 can be further effectively restrained.

Further, since the exhaust ports 262 are formed to be adjacent to each other on the lateral surface of the ceiling heat insulator 252, the exhaust pipe 56 can be formed as a single system to simplify an exhaust configuration. Also, since the exhaust ports 262 are formed on the lateral surface, an overall height can be lowered, compared with a case in which the exhaust mechanism is installed above the heater 206.

Since the supply ports 252a2 are formed in the gas-flow paths 260, heat insulating properties in the portions of the outer edge side of the ceiling heat insulator 252 where the supply ports 252a2 are formed are degraded. In addition, even in the outer edge side of the ceiling heat insulator 252, in the portions where the insulating walls 252a3 and 252b3 are installed, heat insulating properties are not degraded. However, the difference in such local heat insulating properties and in-plane temperature variations of the wafer 200 accompanied therewith are symmetrical with respect to a certain center line of the wafer 200 and thus, can become uniformized by rotating the wafer 200 by the rotary mechanism 254. Accordingly, a desired in-plane temperature distribution can be achieved by adjusting the size of the supply ports 252a2 or the width of the insulating walls 252a3 and 252b3.

In one embodiment, the thicknesses of each part of the ceiling heat insulator 252, the size of the supply ports 252a2, and the widths of the insulating walls 252a3 and 252b3 may be set to achieve a temperature distribution, as illustrated in FIG. 11, where a temperature of the center portion of the wafer 200 is slightly higher than that of the outer edge portion thereof when the wafer 200 is rotated by the rotary mechanism 254. If a process gas is supplied from the outer edge side of the wafer 200, the process gas is first consumed at the outer edge side so that a film thickness of the center side of the wafer 200 may be reduced. In such case, however, by forming the temperature gradient as illustrated in FIG. 11, deposition rates at the center side and at the outer edge side of the wafer 200 become equal to enhance film thickness uniformity.

Hereinafter, modifications of the present disclosure will be described. Specifically, since only a configuration of a ceiling heat insulator is modified from the embodiment described above, only explanation about the ceiling heat insulator will be described.

Figure 21:
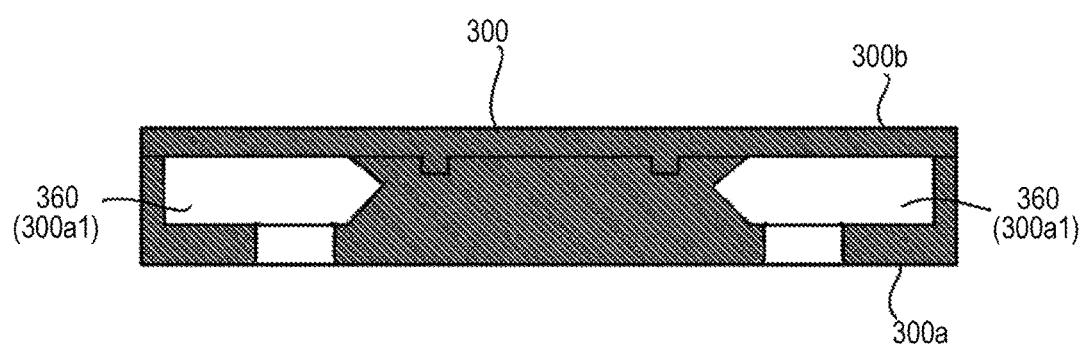
FIG. 21 is a cross-sectional view illustrating a first modification of a ceiling heat insulator according to an embodiment of the present disclosure.

FIG. 21 is a cross-sectional view illustrating a first modification of a ceiling heat insulator. As illustrated in FIG. 21, a ceiling heat insulator 300 according to the first modification includes a lower heat insulator 300a and an upper heat insulator 300b. Gas-flow paths 360 are installed in the ceiling heat insulator 300. Here, the gas-flow paths 360 are formed only with concave portions 300a1 formed in the lower heat insulator 300a. Thus, exhaust ports of a cooling gas are also formed only at the lower heat insulator 300a. The gas-flow paths 360 are installed outside the outer edge portion of the wafer, when viewed from a plan view. The ceiling heat insulator 300 may also provide the same effect as that described above.

Figure 22:
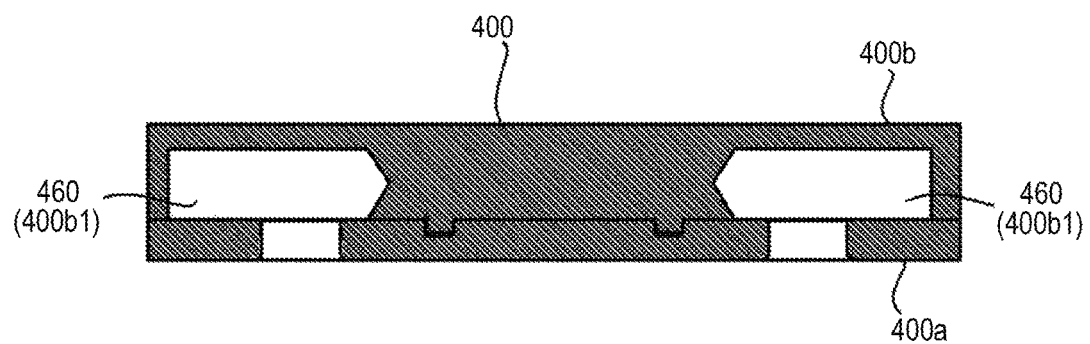
FIG. 22 is a cross-sectional view illustrating a second modification of a ceiling heat insulator according to an embodiment of the present disclosure.

FIG. 22 is a cross-sectional view illustrating a second modification of a ceiling heat insulator. As illustrated in FIG. 22, a ceiling heat insulator 400 according to the second modification includes a lower heat insulator 400a and an upper heat insulator 400b. Gas-flow paths 460 are installed in the ceiling heat insulator 400. Here, the gas-flow paths 460 are formed only with concave portions 400b1 formed in the upper heat insulator 400b. Thus, exhaust ports of a cooling gas are also formed only at the upper heat insulator 400b. The gas-flow paths 460 are installed outside the outer edge portion of the wafer, when viewed from a plan view. The ceiling heat insulator 400 may also provide the same effect as that of the ceiling heat insulator described above.

Figure 23:
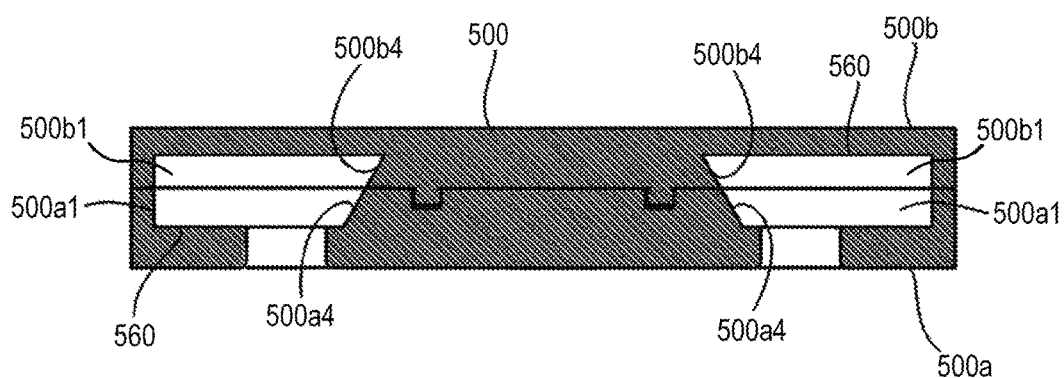
FIG. 23 is a cross-sectional view illustrating a third modification of a ceiling heat insulator according to an embodiment of the present disclosure.

FIG. 23 is a cross-sectional view illustrating a third modification of a ceiling heat insulator. As illustrated in FIG. 23, in a ceiling heat insulator 500 according to the third modification, a tapered portion 500a4 installed in a concave portion 500a1 of a lower heat insulator 500a and a tapered portion 500b4 installed in a concave portion 500b1 of an upper heat insulator 500b are continuous. Even though the tapered portions are configured in this manner, a thickness of the ceiling heat insulator 500 (heat insulating properties thereof) can be continuously changed from the center side to an outer edge side. Further, the concave portion 500a1 and the concave portion 500b1 (and the gas-flow paths 560 formed thereby) are formed outside the outer edge portion of the wafer when viewed from a plan view. The ceiling heat insulator 500 may also provide the same effect as that of the ceiling heat insulator described above.

Figure 24:
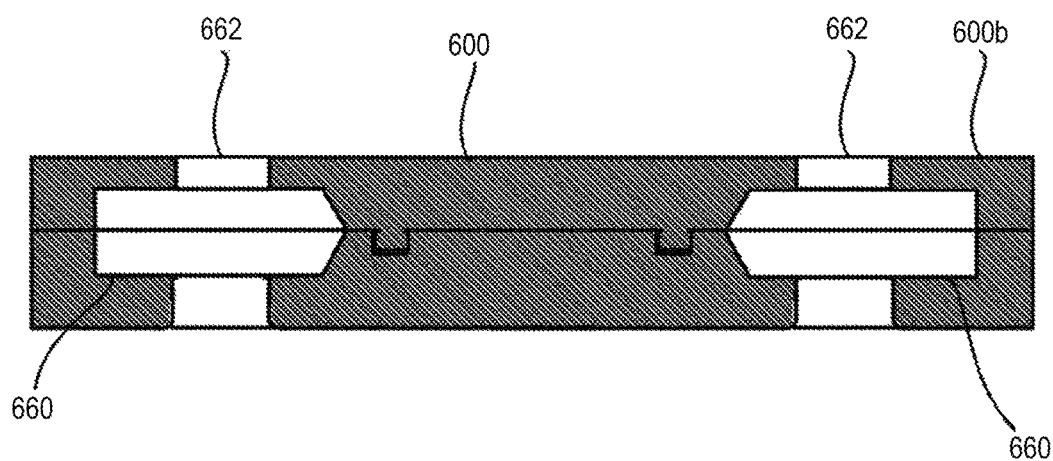
FIG. 24 is a cross-sectional view illustrating a fourth modification of a ceiling heat insulator according to an embodiment of the present disclosure.

FIG. 24 is a cross-sectional view illustrating a fourth modification of a ceiling heat insulator. As illustrated in FIG. 24, in a ceiling heat insulator 600 according to the fourth modification, exhaust ports 662 communicating with respective gas-flow paths 660 are formed in an upper heat insulator 600b. Further, the exhaust ports 662 are formed on an outerside of an outer edge portion of the wafer when viewed from a plan view. This modification may also provide the same effect as that of the ceiling heat insulator described above, except that two exhaust pipe systems (not shown) are required and an overall height of a heater including the exhaust pipes increases.

Figure 25:
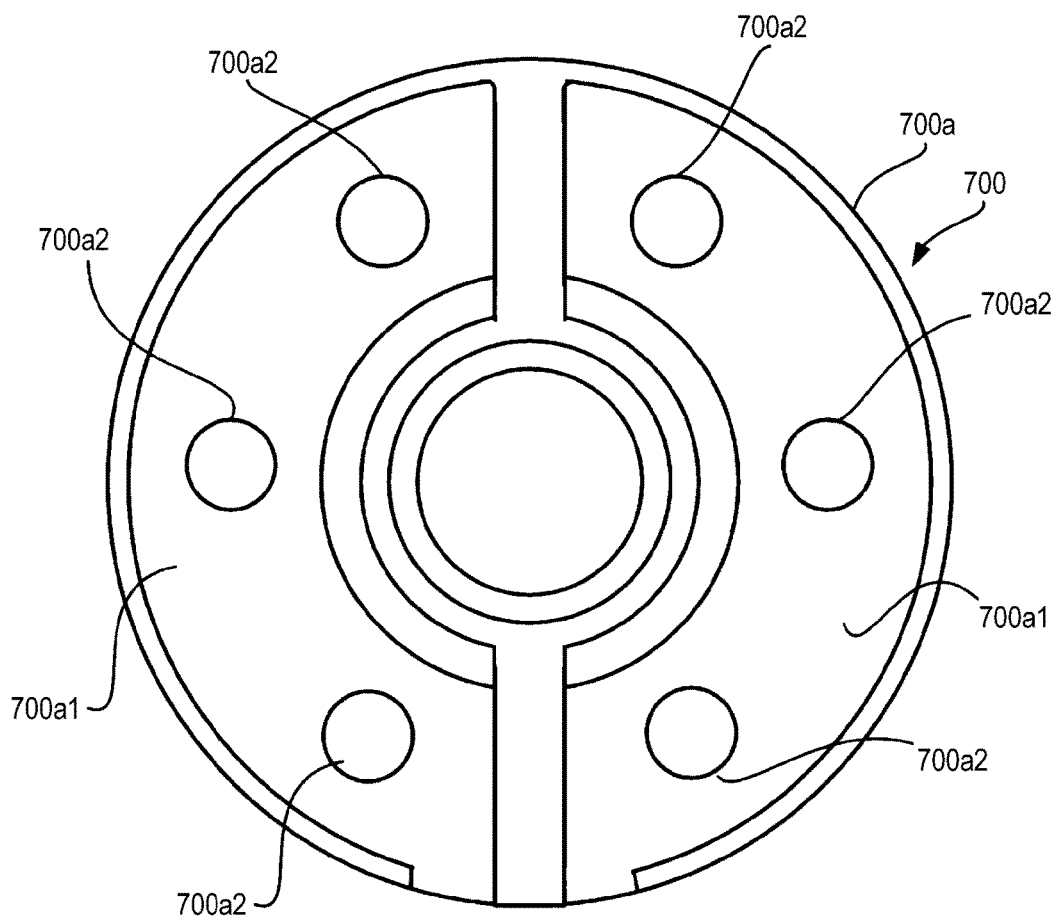
FIG. 25 is a plan view of a lower heat insulator representing the fourth modification of the ceiling heat insulator according to an embodiment of the present disclosure.
Figure 26:
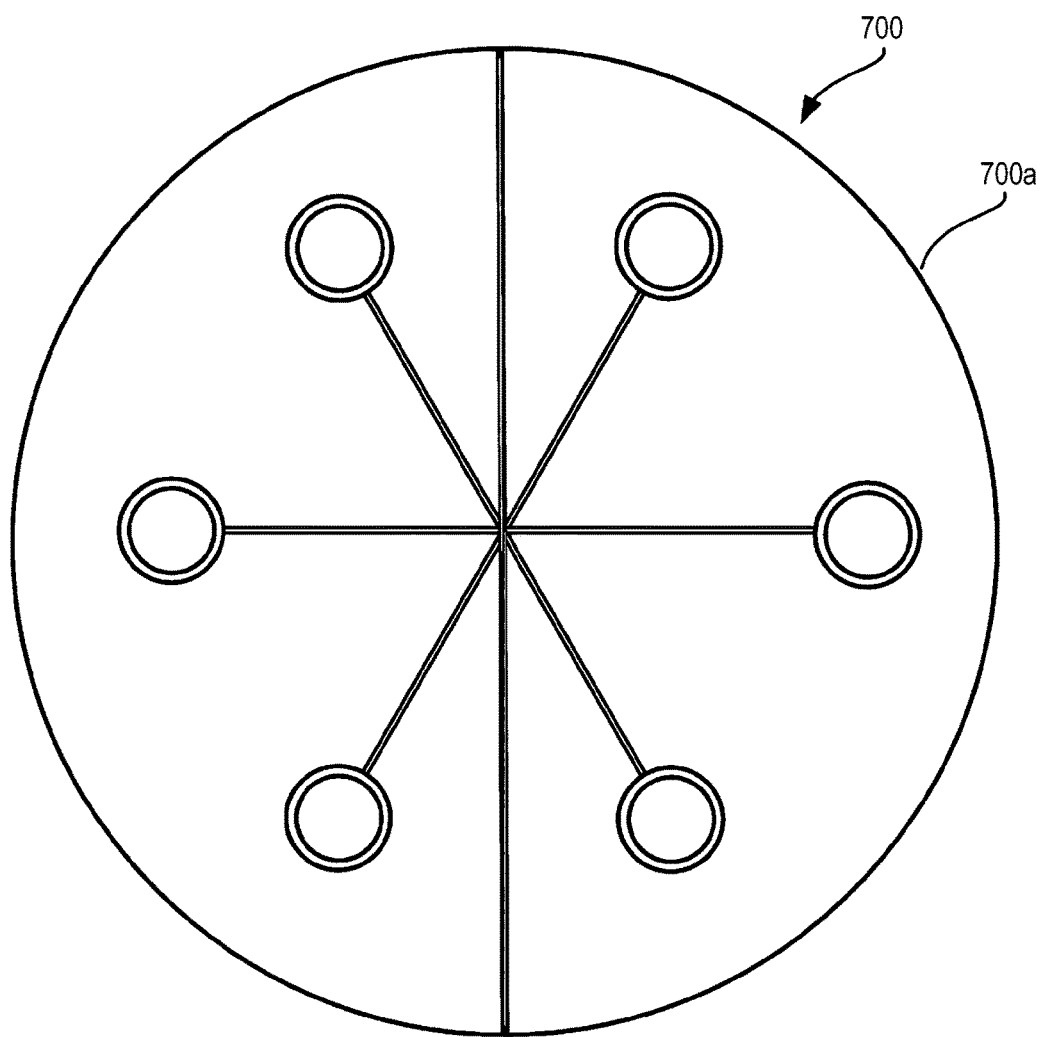
FIG. 26 is a bottom view of the lower heat insulator representing the fourth modification of the ceiling heat insulator according to an embodiment of the present disclosure.

FIG. 25 is a plan view of a lower heat insulator illustrating the fourth modification of the ceiling heat insulator and FIG. 26 is a bottom view of the lower heat insulator representing the fourth modification of the ceiling heat insulator. As illustrated, in a ceiling heat insulator 700 according to the fourth modification, a plurality of supply ports 700a2 are formed in each of concave portions 700a1 of a lower heat insulator 700a. In the illustrated example, three supply ports 700a2 are formed in each of two concave portions 700a1. The supply ports 700a2 are disposed on a concentric circle having its center on a center portion of the ceiling heat insulator 700 to be spaced apart from one another as much as possible, by an interval of 60°. Further, the concave portion 700a1 and the concave portion 700b1 (and the gas-flow paths formed thereby) are formed outside the outer edge portion of the wafer when viewed from a plan view. Similarly, each supply port 700a2 is also formed outside the outer edge portion of the wafer when viewed from a plan view. The fourth modification may also provide the same effect as that of the ceiling heat insulator described above. In the fourth modification, since the plurality of supply ports 700a2 are formed in the single concave portion 700a1, convection may be generated between the supply ports 700a2. However, since all the supply ports 700a2 are formed outside the outer edge portion of the wafer when viewed from a plan view, a resulting influence on the temperature distribution of the wafer is smaller than the case of the configuration of the heater illustrated in FIG. 18.

Figure 27:
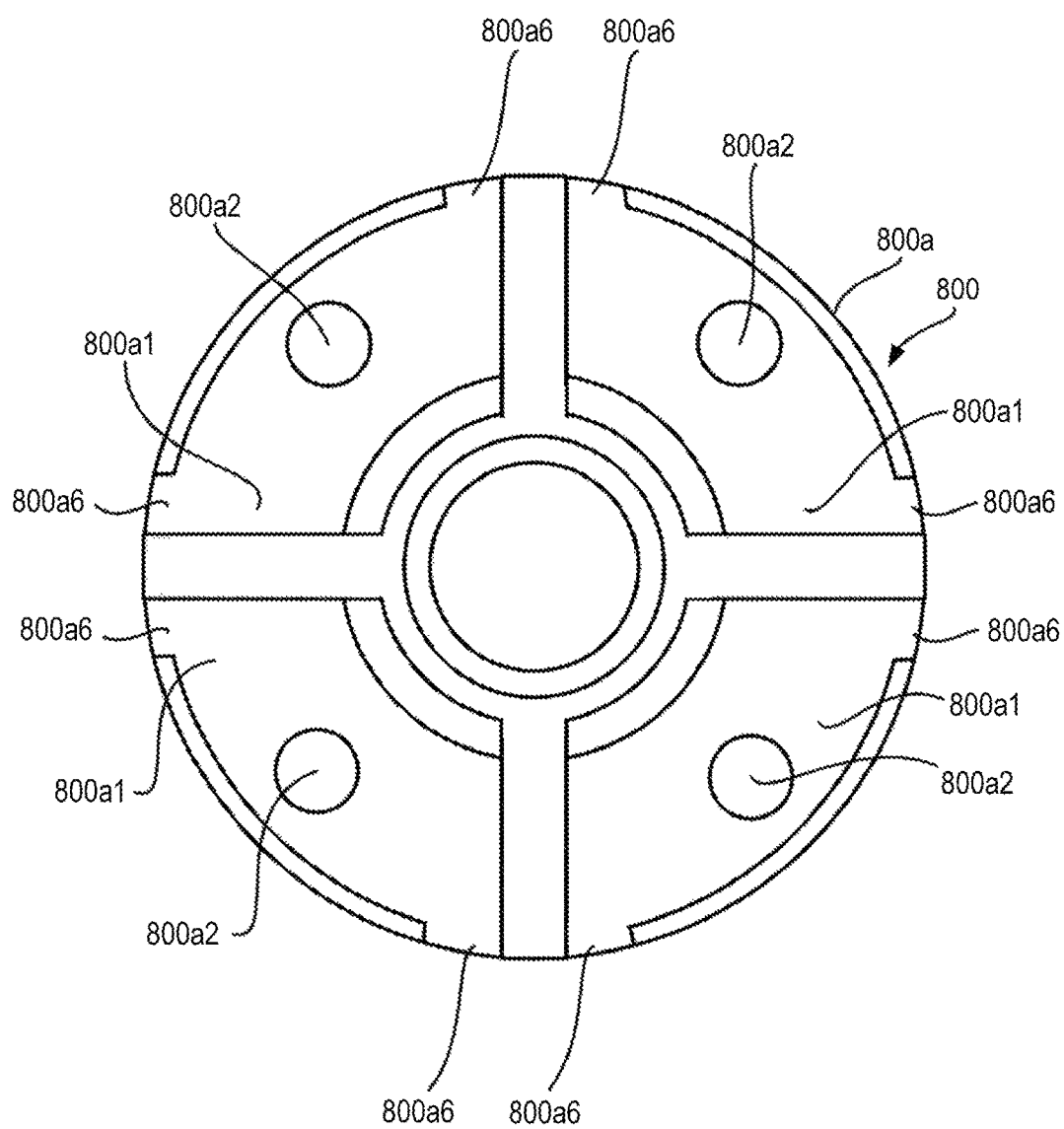
FIG. 27 is a plan view of a lower heat insulator representing a fifth modification of the ceiling heat insulator according to an embodiment of the present disclosure.
Figure 28:
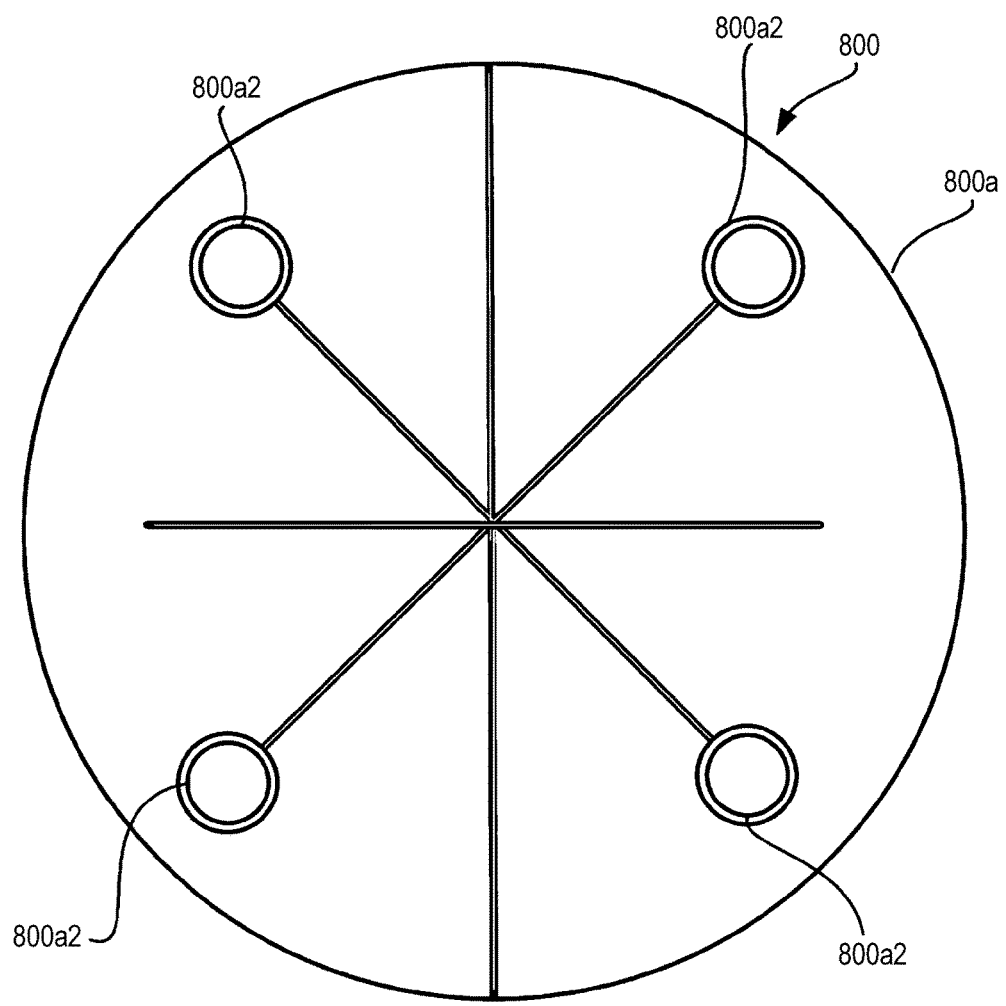
FIG. 28 is a bottom view of the lower heat insulator representing the fifth modification of the ceiling heat insulator according to an embodiment of the present disclosure.
Figure 29:
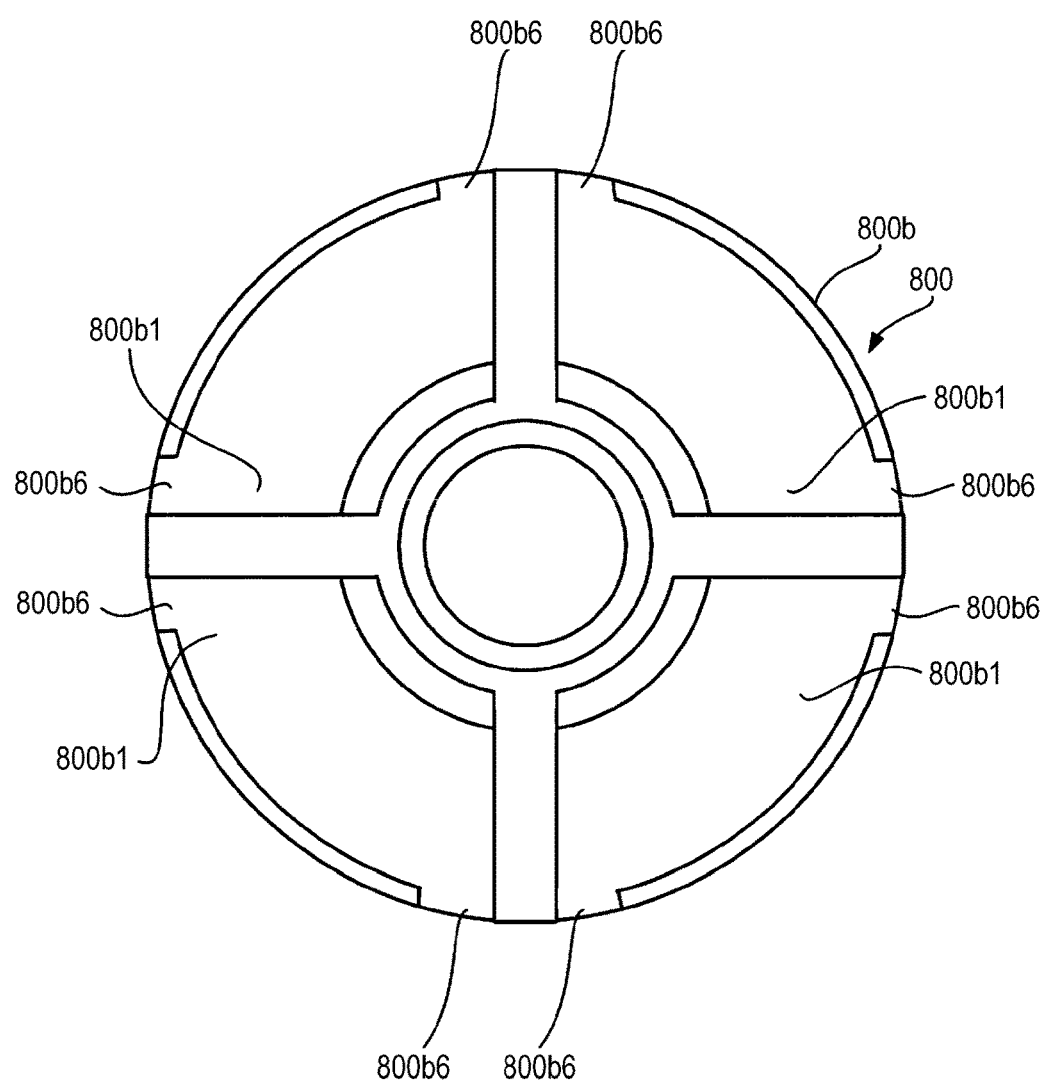
FIG. 29 is a bottom view of an upper heat insulator representing the fifth modification of the ceiling heat insulator according to an embodiment of the present disclosure.

FIG. 27 is a plan view of a lower heat insulator illustrating a fifth modification of a ceiling heat insulator and FIG. 28 is a bottom view of the lower heat insulator illustrating the fifth modification of the ceiling heat insulator. FIG. 29 is a bottom view of an upper heat insulator illustrating the fifth modification of the ceiling heat insulator. As illustrated, in a ceiling heat insulator 800 according to the fifth modification, four concave portions 800a1 respectively having a circular arc shape are formed in a lower heat insulator 800a. In each concave portion 800a1, a supply port 800a2 and cutout portions 800a6 are formed. Further, four concave portions 800b1 having a circular arc shape are also formed in an upper heat insulator 800b and cutout portions 800b6 are formed in each concave portion 800b1. Two cutout portions 800a6 are disposed to be adjacent on the lateral surface of the ceiling heat insulator 800. Similarly, two cutout portions 800b6 are also disposed to be adjacent on the lateral surface of the ceiling heat insulator 800. Further, the concave portions 800a1 and the concave portions 800b1 (and the gas-flow paths formed thereby) are formed outside the outer edge portion of the wafer when viewed from a plan view. Similarly, each supply port 800a2 is also formed outside the outer edge portion of the wafer when viewed from a plan view. This modification may also provide the same effect as that of the ceiling heat insulator described above, except that a plurality of exhaust pipe systems (not shown) are required. Further, even though in FIG. 27, two cutout portions 800b6 are formed in each concave portion 800b1, it is still possible to have only one cutout portion 800b6 in each concave portion 800b1.

Further, a ceiling heat insulator may also be formed by combining the modifications described above. Also, the number of gas-flow paths, supply ports, and exhaust ports are not limited to the foregoing examples, but may be modified depending on the size of the ceiling heat insulator, or the like.

Aspects of Present Disclosure

The present disclosure will be further stated with the following supplementary aspects.

[Supplementary Note 1]
A substrate processing apparatus, including:
a reaction container configured to accommodate a substrate; and
a heating apparatus having a side wall heat insulator located at an outer circumference of the reaction container, a ceiling heat insulator located above the side wall heat insulator, a heating element located on an inner wall of the side wall heat insulator, and a cooling gas flow path located between the reaction container and the side wall heat insulator,
wherein the ceiling heat insulator is configured to include a gas-flow path located therein to allow a cooling gas to pass therethrough so that the ceiling heat insulator has a solid cross-sectional area in an outer edge side of the ceiling heat insulator that is smaller than that in a center side of the ceiling heat insulator.

[Supplementary Note 2]
The substrate processing apparatus of Supplementary Note 1,
wherein the gas-flow path includes a space of a circular arc shape having its center at a central portion of the ceiling heat insulator.

[Supplementary Note 3]
The substrate processing apparatus of Supplementary Note 1 or 2,
wherein the gas-flow path includes a supply port configured to supply the cooling gas and an exhaust port configured to discharge the supplied cooling gas, and
wherein the supply port is located in a position outside the substrate when viewed from a plan view.

[Supplementary Note 4]
The substrate processing apparatus of any one of Supplementary Notes 1 to 3,
wherein the gas-flow path is located in a position outside the substrate when viewed from a plan view.

[Supplementary Note 5]

The substrate processing apparatus of any one of Supplementary Notes 1 to 4,
wherein the gas-flow path has a cross-sectional area that gets reduced toward a center side of the ceiling heat insulator.

[Supplementary Note 6]

The substrate processing apparatus of any one of Supplementary Notes 1 to 5,
wherein there are a plurality of gas-flow paths having one or more insulating walls located therebetween.

[Supplementary Note 7]

The substrate processing apparatus of Supplementary Note 6,
wherein each of the plurality of gas-flow paths includes a supply port configured to supply the cooling gas and an exhaust port configured to discharge the supplied cooling gas.

[Supplementary Note 8]

The substrate processing apparatus of Supplementary Note 7,
wherein the supply ports included in the plurality of gas-flow paths are formed to be spaced apart from one another to the maximum on a concentric circle having its center at a central portion of the ceiling heat insulator.

[Supplementary Note 9]

The substrate processing apparatus of Supplementary Note 7 or 8,
wherein the exhaust ports included in the plurality of gas-flow paths are formed to be adjacent to one another on a lateral surface of the ceiling heat insulator.

[Supplementary Note 10]

A substrate processing apparatus, including:
a reaction container configured to accommodate a substrate; and
a heating apparatus having a side wall heat insulator located at an outer circumference of the reaction container, a ceiling heat insulator located above the side wall heat insulator, a heating element located on an inner wall of the side wall heat insulator, and a cooling gas flow path located between the reaction container and the side wall heat insulator,
wherein the ceiling heat insulator is configured to include a gas-flow path having a space of a circular arc shape having its center at a central portion of the ceiling heat insulator and allowing a cooling gas to pass therethrough.

[Supplementary Note 11]

A heating apparatus, including:
a side wall heat insulator located at an outer circumference of a reaction container;
a ceiling heat insulator located above the side wall heat insulator;
a heating element located on an inner wall of the side wall heat insulator; and
a cooling gas flow path located between the reaction container and the side wall heat insulator,
wherein the ceiling heat insulator is configured to include a gas-flow path located therein to allow a cooling gas to pass therethrough so that the ceiling heat insulator has a solid cross-sectional area in an outer edge side of the ceiling heat insulator that is smaller than that in a center side of the ceiling heat insulator.

[Supplementary Note 12]

A heating apparatus, including:
a side wall heat insulator located at an outer circumference of a reaction container;
a ceiling heat insulator located above the side wall heat insulator;
a heating element located in on inner wall of the side wall heat insulator; and
a cooling gas flow path located between the reaction container and the side wall heat insulator,
wherein the ceiling heat insulator is configured to include a gas-flow path having a space of a circular arc shape having its center at a central portion of the ceiling heat insulator and allowing a cooling gas to pass therethrough.

[Supplementary Note 13]

A ceiling heat insulator,
wherein the ceiling heat insulator is located above a side wall heat insulator of a heating apparatus for a substrate processing apparatus, and
wherein the ceiling heat insulator includes a gas-flow path located therein to allow a cooling gas to pass therethrough so that the ceiling heat insulator has a solid cross-sectional area in an outer edge side of the ceiling heat insulator that is smaller than that in a center side of the ceiling heat insulator.

[Supplementary Note 14]

A ceiling heat insulator,
wherein the ceiling heat insulator is located above a side wall heat insulator of a heating apparatus for a substrate processing apparatus, and
wherein the ceiling heat insulator includes a gas-flow path having a space of a circular arc shape having its center at a central portion of the ceiling heat insulator and allowing a cooling gas to pass therethrough.

[Supplementary Note 15]

A method of manufacturing a semiconductor device, including,
cooling a substrate accommodated in a reaction container by allowing a cooling gas to flow to a cooling gas flow path located between the reaction container and a side wall heat insulator positioned at an outer circumference of the reaction container, and allowing the cooling gas to flow to a gas-flow path located in a ceiling heat insulator,
wherein the ceiling heat insulator is located above the side wall heat insulator and also includes the gas-flow path so that the ceiling heat insulator has a solid cross-sectional area in an outer edge side of the ceiling heat insulator that is smaller than that in a center side of the ceiling heat insulator.

[Supplementary Note 16]

A method of manufacturing a semiconductor device, including,
cooling a substrate accommodated in a reaction container by allowing a cooling gas to flow to a cooling gas flow path located between the reaction container and a side wall heat insulator positioned at an outer circumference of the reaction container, and allowing the cooling gas to flow to a gas-flow path located in a ceiling heat insulator,
wherein the gas-flow path is configured to have a space of a circular arc shape having its center at a central portion of the ceiling heat insulator, and
wherein the ceiling heat insulator is located above the side wall heat insulator.

[Supplementary Note 17]

A method of manufacturing a semiconductor device, including, heating a substrate accommodated in a reaction container by using a heating apparatus, wherein the heating apparatus including a side wall heat insulator located at an outer circumference of the reaction container, a ceiling heat insulator located above the side wall heat insulator, a heating element located in an inner wall of the side wall heat insulator, and a cooling gas flow path located between the reaction container and the side wall heat insulator, and wherein the ceiling heat insulator includes a gas-flow path located therein to allow a cooling gas to pass therethrough so that the ceiling heat insulator has a solid cross-sectional area in a circumference side of the ceiling heat insulator that is smaller than that in a center side of the ceiling heat insulator.

[Supplementary Note 18]

A method of manufacturing a semiconductor device, including, heating a substrate accommodated in a reaction container by using a heating apparatus, wherein the heating apparatus includes a side wall heat insulator located at an outer circumference of the reaction container, a ceiling heat insulator located above the side wall heat insulator, a heating element located in an inner wall of the side wall heat insulator, and a cooling gas flow path located between the reaction container and the side wall heat insulator, and wherein the ceiling heat insulator includes a gas-flow path having a space of a circular arc shape having its center at a central portion of the ceiling heat insulator and allowing a cooling gas to pass therethrough.

According to the present disclosure, in-plane temperature uniformity of a substrate can be improved.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A ceiling heat insulator, which is located above a side wall heat insulator of a heating apparatus for a substrate processing apparatus for processing a substrate, the ceiling heat insulator comprising:

an upper heat insulator;

a lower heat insulator; and at least one gas-flow path allowing a cooling gas to pass therethrough so that the ceiling heat insulator includes a portion which has a solid cross-sectional area in an outer edge side of the ceiling heat insulator that is smaller than that in a center side of the ceiling heat insulator, wherein each of the upper heat insulator and the lower heat insulator includes a concave portion, which is located outside the substrate and has a circular arc shape, a center of the circular arc shape being located at a central portion of the ceiling heat insulator, and wherein the upper heat insulator and the lower heat insulator overlap with each other so that the concave portion of the upper heat insulator and the concave portion of the lower heat insulator are disposed to face each other and define the at least one gas-flow path.

2. The ceiling heat insulator of claim 1, wherein the concave portion is formed to be symmetrical with respect to a central line on a horizontal plane of the ceiling heat insulator.

3. The ceiling heat insulator of claim 1, wherein the at least one gas-flow path is configured so that a portion of the at least one gas-flow path formed in the upper heat insulator is wider than a portion of the at least one gas-flow path formed in the lower heat insulator in a vertical section.

4. The ceiling heat insulator of claim 1, wherein the at least one gas-flow path is configured so that a portion of the at least one gas-flow path formed in the lower heat insulator is wider than a portion of the at least one gas-flow path formed in the upper heat insulator in a vertical section.

5. The ceiling heat insulator of claim 1, wherein the at least one gas-flow path has a cross-sectional area that gets reduced toward the center side of the ceiling heat insulator.

6. The ceiling heat insulator of claim 1, further comprising one or more insulating walls, wherein the at least one gas-flow path comprises a plurality of gas-flow paths, and wherein each of the insulating walls is located between the gas-flow paths so that each of the insulating walls divides the concave portions spatially.

7. The ceiling heat insulator of claim 1, wherein the at least one gas-flow path comprises a plurality of gas-flow paths, and wherein each of the plurality of gas-flow paths includes a supply port configured to supply the cooling gas and an exhaust port configured to discharge the supplied cooling gas.

8. The ceiling heat insulator of claim 7, wherein the supply ports included in the plurality of gas-flow paths are formed to be spaced apart from one another by 180° on a concentric circle having its center at the central portion of the ceiling heat insulator.

9. The ceiling heat insulator of claim 7, wherein the exhaust ports included in the plurality of gas-flow paths are adjacent to one another on a lateral surface of the ceiling heat insulator.

10. A heating apparatus, comprising the ceiling heat insulator of claim 1, wherein the heating apparatus further comprises:

the side wall heat insulator located at an outer circumference of a reaction container;

a heating element located on an inter wall of the side wall heat insulator; and a cooling gas flow path located between the reaction container and the side wall heat insulator.

11. A substrate processing apparatus, comprising the heating apparatus of claim 10, wherein the substrate processing apparatus comprises the reaction container configured to accommodate the substrate located therein.

12. A method of manufacturing a semiconductor device, comprising, cooling a substrate accommodated in a reaction container by allowing a cooling gas to flow to a first gas flow path installed between the reaction container and a side wall heat insulator positioned at an outer circumference of the reaction container, and allowing the first gas to flow to a second gas-flow path installed in a ceiling heat insulator, wherein the ceiling heat insulator is located above the side wall heat insulator and includes the second gas-flow path so that the ceiling heat insulator has a solid cross-sectional area in a circumference side of the ceiling heat insulator that is smaller than that in a center side of the ceiling heat insulator, wherein the ceiling heat insulator includes an upper heat insulator and a lower heat insulator, wherein each of the upper heat insulator and the lower heat insulator includes a concave portion, which is located outside the substrate and has a circular arc shape, a center of the circular arc shape being located at a central portion of the ceiling heat insulator, and wherein the upper heat insulator and the lower heat insulator overlap with each other so that the concave portion of the upper heat insulator and the concave portion of the lower heat insulator are disposed to face each other.

* * * * *